(12) United States Patent
Nagata

(10) Patent No.: US 11,169,216 B2
(45) Date of Patent: Nov. 9, 2021

(54) INFORMATION PROCESSING APPARATUS, METHOD AND NON-TRANSITORY COMPUTER-READABLE STORAGE MEDIUM

(71) Applicant: FUJITSU LIMITED, Kawasaki (JP)

(72) Inventor: Jun-ichi Nagata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 343 days.

(21) Appl. No.: 16/013,328

(22) Filed: Jun. 20, 2018

(65) Prior Publication Data

US 2019/0011503 A1 Jan. 10, 2019

(30) Foreign Application Priority Data

Jul. 6, 2017 (JP) .............................. JP2017-132922

(51) Int. Cl.
*G01R 31/36* (2020.01)
*G01R 31/389* (2019.01)
*G01R 31/388* (2019.01)
*G01R 31/3842* (2019.01)
*G01R 31/392* (2019.01)

(52) U.S. Cl.
CPC .......... *G01R 31/389* (2019.01); *G01R 31/36* (2013.01); *G01R 31/3624* (2013.01); *G01R 31/3637* (2013.01); *G01R 31/3662* (2013.01); *G01R 31/3679* (2013.01); *G01R 31/388* (2019.01);

(Continued)

(58) Field of Classification Search
CPC ................ G01R 31/389; G01R 31/388; G01R 31/3842; G01R 31/3662; G01R 31/3679; G01R 31/3637; G01R 31/3624; G01R 31/392

See application file for complete search history.

(56) References Cited

U.S. PATENT DOCUMENTS 6,339,264 B1 * 1/2002 Wang ................... H02J 7/0048
307/132 E
10,180,460 B1 * 1/2019 Castelaz ................. B60L 58/15
(Continued)

FOREIGN PATENT DOCUMENTS

JP 7-87007 A 3/1995
JP 2015-14537 A 1/2015
(Continued)

OTHER PUBLICATIONS

Japanese Office Action dated Apr. 6, 2021 for corresponding Japanese Patent Application No. 2017-132922, with English Translation, 10 pages.

*Primary Examiner* — Mohammad K Islam
(74) *Attorney, Agent, or Firm* — Fujitsu Patent Center

(57) ABSTRACT

An information processing apparatus includes a memory, and a processor coupled to the memory and configured to, execute a first process by using electric power supplied from a battery, identify a first change amount of electric current supplied from the battery, the first change amount being caused by execution of the first process, measure a second change amount of an output voltage of the battery, the second change being caused by the execution of the first process, measure an internal impedance of the battery based on the first change amount and the second change amount, and identify a remaining amount of the battery by using the measured internal impedance.

12 Claims, 30 Drawing Sheets

(52) U.S. Cl.
CPC ........ *G01R 31/3842* (2019.01); *G01R 31/392* (2019.01)

(56) References Cited

U.S. PATENT DOCUMENTS

| | | | |
|---|---|---|---|
| 10,209,317 B2* | 2/2019 | Ohkawa | G01R 31/389 |
| 2004/0076872 A1* | 4/2004 | Kinoshita | H01M 10/48 |
| | | | 429/61 |
| 2007/0114971 A1* | 5/2007 | Uesaka | G01R 31/3842 |
| | | | 320/132 |
| 2008/0169819 A1* | 7/2008 | Ishii | G01R 31/389 |
| | | | 324/430 |
| 2008/0204031 A1* | 8/2008 | Iwane | G01R 31/389 |
| | | | 324/430 |
| 2009/0266631 A1* | 10/2009 | Kikuchi | H01M 10/443 |
| | | | 180/65.265 |
| 2010/0231226 A1* | 9/2010 | Yamashita | G01R 19/16542 |
| | | | 324/433 |
| 2012/0029851 A1* | 2/2012 | Nakayama | G01R 31/396 |
| | | | 702/63 |
| 2014/0333265 A1* | 11/2014 | Kinjo | H02J 7/007 |
| | | | 320/134 |
| 2016/0069963 A1* | 3/2016 | Hebiguchi | H02J 7/005 |
| | | | 324/430 |
| 2016/0091573 A1* | 3/2016 | Shiraishi | G01R 31/389 |
| | | | 324/430 |
| 2016/0201932 A1 | 7/2016 | Endo et al. | |

FOREIGN PATENT DOCUMENTS

| | | |
|---|---|---|
| JP | 2015-048957 | 3/2015 |
| JP | 2017-069011 | 4/2017 |

\* cited by examiner

FIG. 26

| OPERATION CHANGE TIME INTERVAL | VOLTAGE MEASUREMENT TIME INTERVAL | COMPLETION NUMBER OF TIMES OF VOLTAGE MEASUREMENT | SPECIFIED NUMBER OF TIMES OF VOLTAGE MEASUREMENT | RECTANGULAR WAVE PERIOD | RECTANGULAR WAVE FREQUENCY | SAMPLE FREQUENCY | SAMPLE TIME |
|---|---|---|---|---|---|---|---|
| 1024ms | 1ms | 1024 | 1024 | 2048ms | 0.49Hz | 1ksps | 1024ms |
| 512ms | 1ms | 1024 | 512 | 1024ms | 0.98Hz | 1ksps | 1024ms |
| 128ms | 1ms | 1024 | 128 | 128ms | 7.81Hz | 1ksps | 1024ms |

INFORMATION PROCESSING APPARATUS, METHOD AND NON-TRANSITORY COMPUTER-READABLE STORAGE MEDIUM

CROSS-REFERENCE TO RELATED APPLICATION

This application is based upon and claims the benefit of priority of the prior Japanese Patent Application No. 2017-132922, filed on Jul. 6, 2017, the entire contents of which are incorporated herein by reference.

FIELD

The embodiments discussed herein are related to an information processing apparatus, a method and a non-transitory computer-readable storage medium.

BACKGROUND

In related art, a technique for calculating the remaining amount of a battery by measuring the internal impedance of the battery is known. Related techniques are disclosed in, for example, Japanese Laid-open Patent Publication No. 2017-069011.

SUMMARY

According to an aspect of the invention, an information processing apparatus includes a memory, and a processor coupled to the memory and configured to, execute a first process by using electric power supplied from a battery, identify a first change amount of electric current supplied from the battery, the first change amount being caused by execution of the first process, measure a second change amount of an output voltage of the battery, the second change being caused by the execution of the first process, measure an internal impedance of the battery based on the first change amount and the second change amount, and identify a remaining amount of the battery by using the measured internal impedance.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 26 is a table illustrating specific examples of setting numerical values.

DESCRIPTION OF EMBODIMENTS

Figure 1:
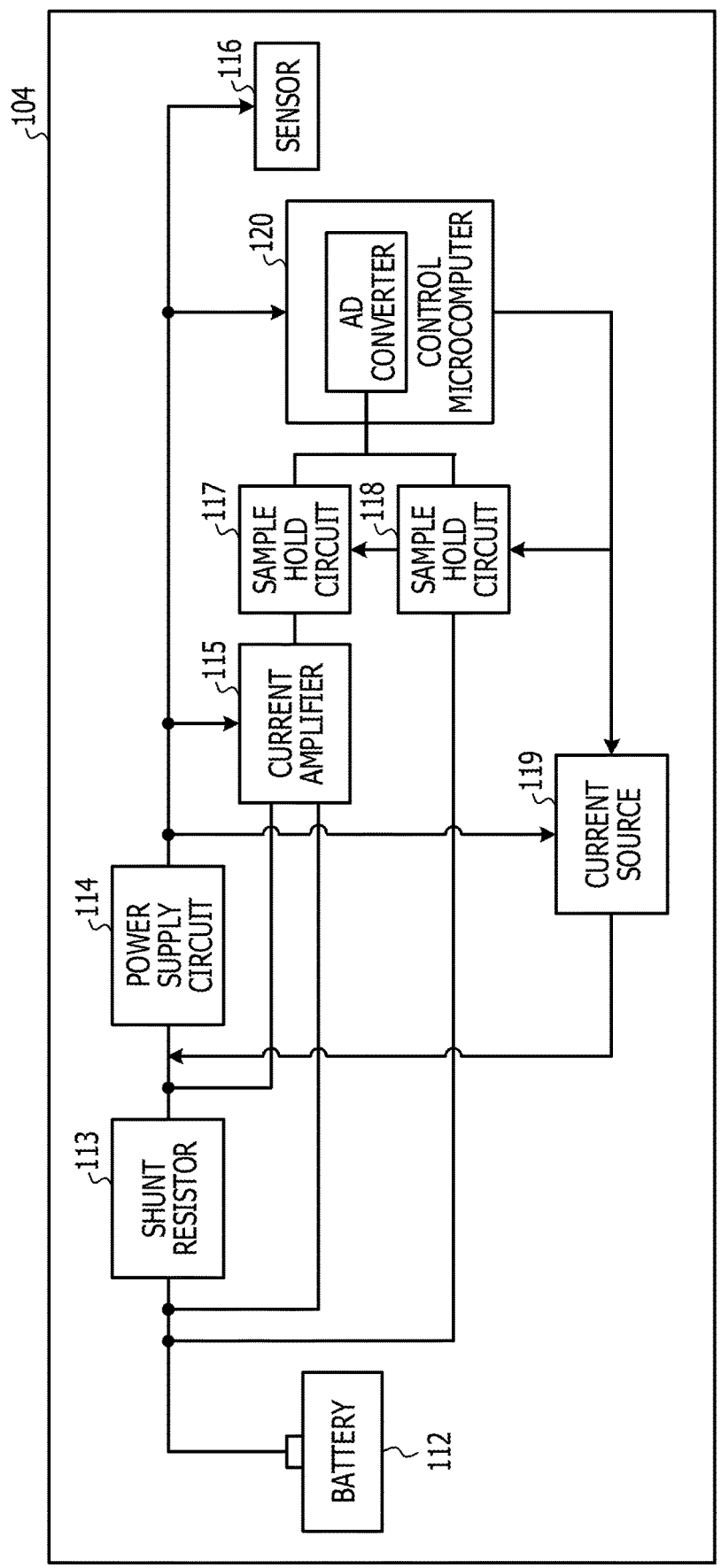
FIG. 1 is a diagram illustrating an example hardware configuration of a sensor device in related art.

FIG. 1 is a diagram illustrating an example configuration of a sensor device having a function of measuring the internal impedance of a battery in related art. A sensor device 104 is a device including a sensor 116 that detects predetermined observational data.

A control microcomputer 120 controls a current source 119 which operates with the power supplied from a power supply circuit 114, and applies AC current to a battery 112, then simultaneously measures the output current and the output voltage of the battery 112 by sample hold circuits 117, 118. The output current of the battery 112 is measured by the sample hold circuit 117 via a shunt resistor 113 and a current amplifier 115, and the output voltage of the battery 112 is measured by the sample hold circuit 118. The control microcomputer 120 takes the output current and output voltage of the battery 112 simultaneously measured by the sample hold circuits 117, 118 by an analog-to-digital (AD) converter, and measures the internal impedance of the battery 112 by calculating the ratio of those outputs.

However, when the remaining amount of a battery is measured using the internal impedance measured by the configuration as in FIG. 1, a current source and sample hold circuits have to be used to measure the internal impedance, and thus the power consumed by measurement of the remaining amount of the battery increases.

Hereinafter, an embodiment of the present disclosure will be described with reference to the drawings.

Figure 2:
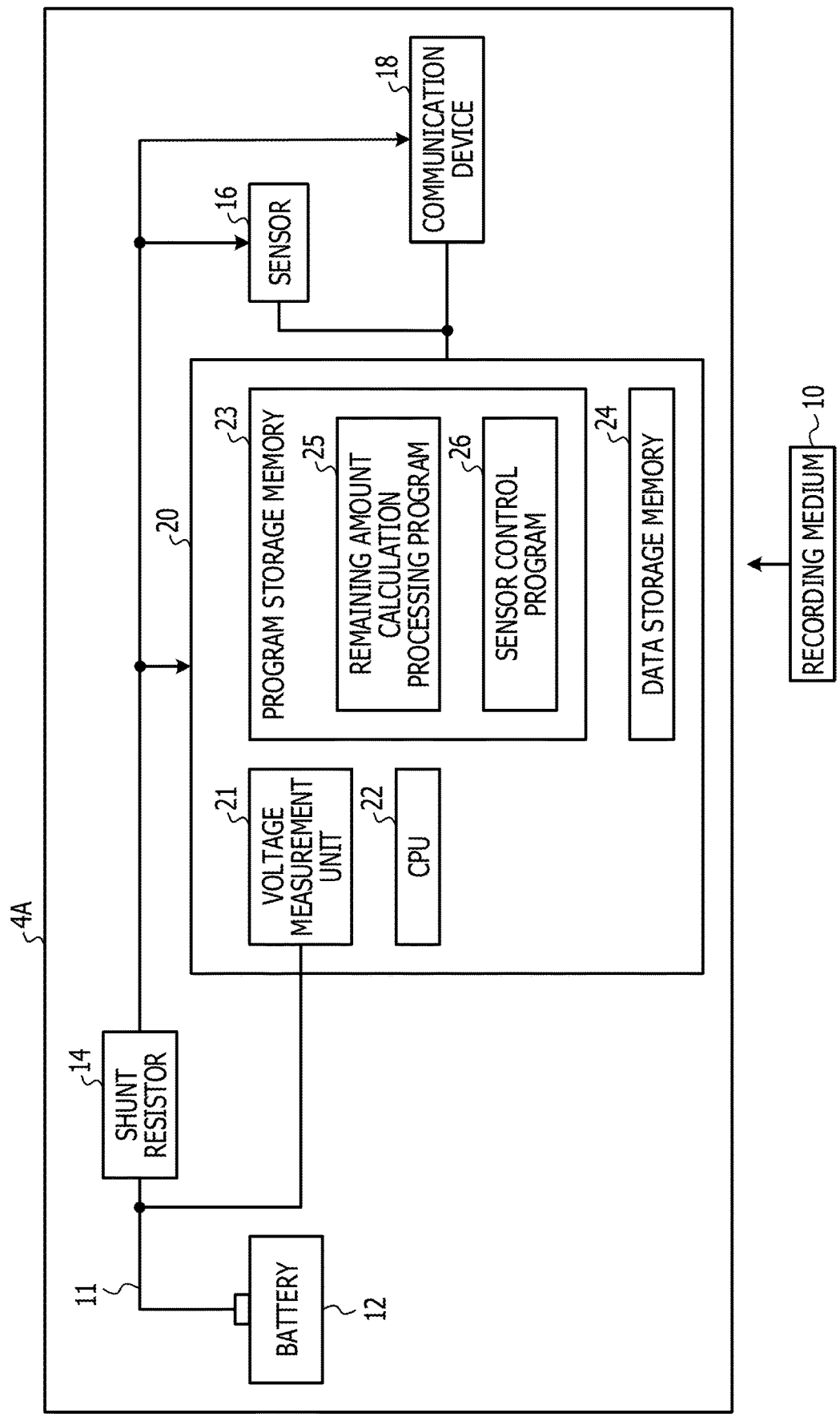
FIG. 2 is a diagram illustrating an example hardware configuration of a sensor device in a first embodiment.

FIG. 2 is a diagram illustrating an example hardware configuration of a sensor device in a first embodiment. The sensor device may be referred to as an internet of things (IoT) device. A sensor device 4A illustrated in FIG. 2 is a device that uses a battery 12 as the power source.

Arrangement of multiple sensor devices in a distributed manner allows observational data (for instance, environmental data such as a temperature) detected by sensor devices in an area to be collected. At an arrangement location where it is difficult to secure an external power source, each sensor device is driven by the power supplied from a battery mounted on the sensor device. In such a battery-driven sensor device, in order to know charge timing and replacement timing for a battery with high accuracy in operational management, it is important to measure the remaining amount of the battery with high accuracy.

Figure 3:
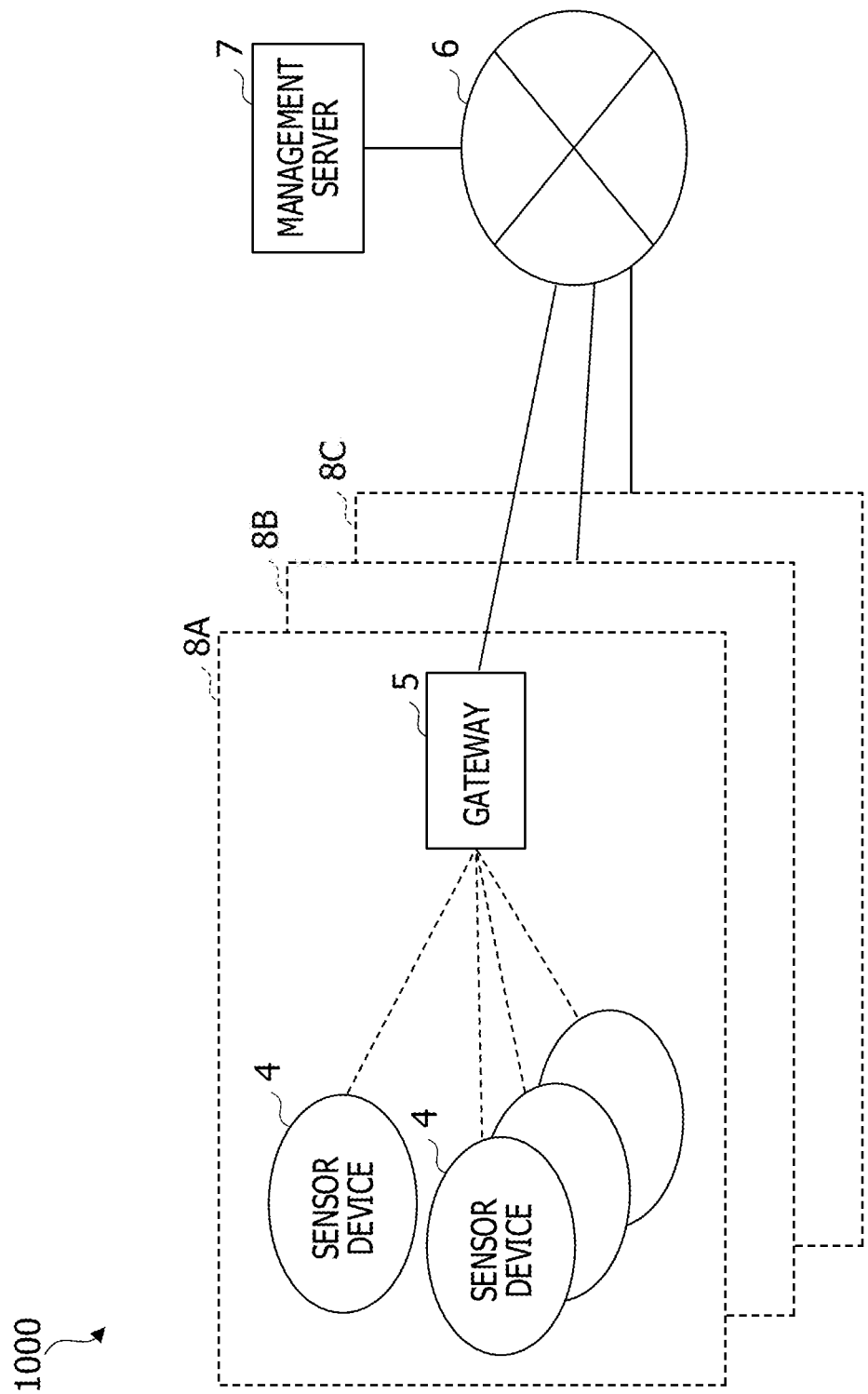
FIG. 3 is a diagram illustrating an example configuration of a battery remaining amount management system in the embodiment of the present disclosure.

FIG. 3 is a diagram illustrating an example configuration of a battery remaining amount management system in the embodiment of the present disclosure. A battery remaining amount management system 1000 illustrated in FIG. 3 includes multiple sensor devices 4, a gateway 5, and a management server 7. The management server 7 is an example of a processing device that processes information collected from each of the multiple sensor devices 4. The management server 7 collects a battery remaining amount measured in each of the sensor devices 4 from each sensor device 4 via the gateway 5 and the network 6, and manages the remaining amount of the battery of each sensor device 4 using the battery remaining amount collected from each sensor device 4. Consequently, even when the sensor devices 4 are distributed in a wide range, the management server 7 may perform remote management such as monitoring the temporal change in the remaining amount of the battery of each sensor device 4.

Specific examples of observational data detected by the sensor device 4 include temperature, humidity, precipitation, water level, voltage, current, power, electric energy, pressure, communication volume, luminance, illuminance, acceleration, and sound. The observational data is not limited to these.

Noted that the management server 7 may directly collect the observational data detected by the sensor device 4 and the remaining amount data of the battery mounted on the sensor device 4 from the sensor device 4 not through the gateway 5. Also, the gateway 5 may serve as a processing device that processes information collected from each of the multiple sensor devices 4. For instance, the gateway 5 may manage the remaining amount of the battery of each sensor device 4.

In FIG. 2, the sensor device 4A includes a battery 12, a power supply circuit 14, a control circuit 20, a sensor 16, and a communication device 18.

The battery 12 may be a primary battery, or a secondary battery. Specific examples of the primary battery include a dry-cell battery. Specific examples of the secondary battery include a lithium ion battery and a lithium polymer battery.

The power supply circuit 14 performs voltage reduction conversion on the DC power of the battery 12, and supplies the DC power with reduced voltage to the control circuit 20, the sensor 16, and the communication device 18. The power supply circuit 14 may not be provided if not desired.

The control circuit 20 is a semiconductor integrated circuit having a function of calculating the remaining amount of the battery 12. The control circuit 20 includes a voltage measurement unit 21, a central processing unit (CPU) 22, a program storage memory 23, and a data storage memory 24. Specific examples of the control circuit 20 include a microcomputer.

The voltage measurement unit 21 measures an output voltage of the battery 12. The voltage measurement unit 21 measures an output voltage of the battery 12, for instance, by monitoring a power source line 11 connected to the battery 12. An element, such as a resistor, may be present in a voltage monitor line between the voltage measurement unit 21 and the battery 12. Specific examples of the voltage measurement unit 21 include an AD converter that converts an analog measured value of the output voltage into a digital measured value.

The CPU 22 is an example of a processor that operates in accordance with a program stored in a memory. At least one program that defines the steps to be executed by the CPU 22 is stored in the program storage memory 23. In the embodiment, a remaining amount calculation processing program 25 that defines the processing steps for calculating the remaining amount of the battery 12, and a sensor control program 26 that defines the processing steps for operating the sensor device 4A (specifically, the control circuit 20) are stored in the program storage memory 23. The data storage memory 24 stores data referred to by the CPU 22 that operates in accordance with a program, and data obtained by the CPU 22 operating in accordance with a program.

At least one program stored in the program storage memory 23 may be provided by a recording medium 10, for instance. When the recording medium 10, on which at least one program is recorded, is set to the sensor device 4A, the program is installed from the recording medium 10 to the program storage memory 23.

Specific examples of the recording medium 10 include a portable recording medium such as a Universal Serial Bus (USB) memory. Specific examples of the program storage memory 23 include a read only memory (ROM) and a flash memory. The recording medium 10 and the program storage memory 23 are each an example of a computer-readable recording medium.

Noted that a program does not have to be installed via the recording medium 10, and may be downloaded via the communication device 18.

The communication device 18 has a modulation processing unit that performs modulation processing at the time of transmission, and a demodulation processing unit that performs demodulation processing at the time of reception.

The sensor 16 detects predetermined observational data. For instance, the sensor 16 detects environment data such as a temperature. The control circuit 20 obtains observational data detected by the sensor 16. When receiving input of an observational data transmission request signal received via the communication device 18, the control circuit 20 transmits from the communication device 18 the observational data obtained from the sensor 16. Thus, the management server 7 (for instance, a cloud server) installed at a location away from the sensor device may collect the observational data detected by a sensor device disposed in each area by transmitting an observational data transmission request signal.

Figure 4:
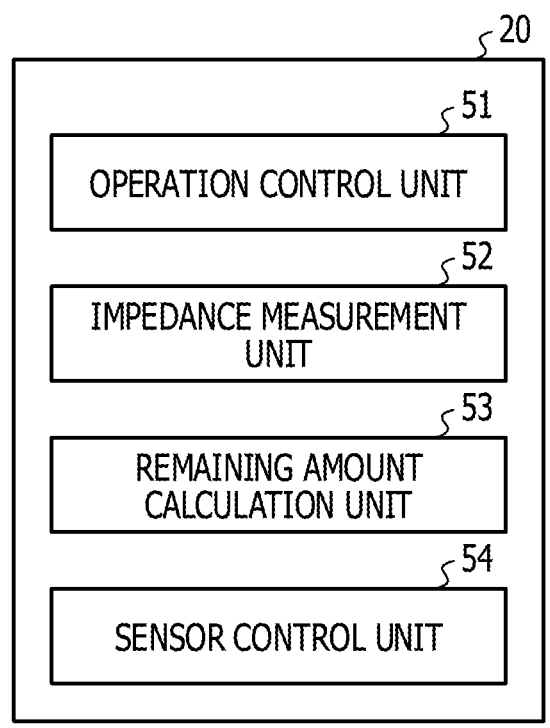
FIG. 4 is a diagram illustrating an example functional configuration of a control circuit in the first embodiment.

FIG. 4 is a diagram illustrating an example functional configuration of a control circuit in the first embodiment. The control circuit 20 has an operation control unit 51, an impedance measurement unit 52, a remaining amount calculation unit 53, and a sensor control unit 54. These functional units are achieved by the processing by execution of the CPU 22, the execution being caused by at least one program stored in the program storage memory 23.

The remaining amount calculation unit 53 calculates the remaining amount of the battery 12. When a remaining amount data transmission request signal is inputted via the communication device 18, the control circuit 20 transmits calculated remaining amount data of the battery 12 from the communication device 18. Therefore, the management server 7 (for instance, a cloud server) installed at a location away from the sensor devices may collect the remaining amount data of the battery 12 mounted in each of the sensor devices 4 disposed in various places by transmitting the remaining amount data transmission request signal. The sensor control unit 54 calculates a time for charging or a time for replacement of the battery 12 based on the calculated remaining amount of the battery 12, and may transmit from the communication device 18 a signal informing of a time for charging or a time for replacement of the battery 12, or a signal informing that the time is approaching or past.

The management server 7 changes the frequency (in other words, the frequency at which each of the sensor devices 4 transmits information) at which information is collected from each of the sensor devices 4 according to the remaining amount data collected from each of the sensor devices 4. The sensor device 4 uses the power of a battery mounted on itself for transmission of information. Consequently, the management server 7 may perform remote adjustment on the battery remaining amount of each of the sensor devices 4 by changing the frequency at which information is collected from each of the sensor devices 4. The management server 7 may change the frequency at which information is collected from each of the sensor devices 4, for instance, by changing the frequency at which a data transmission request signal, such as an environmental data transmission request signal, is transmitted.

For instance, the management server 7 changes the frequency of transmission of information by the sensor device 4 area by area so that the battery remaining amounts of the sensor devices 4 become uniform in the same area. Consequently, for instance, the running out times of the battery remaining amounts of the sensor devices 4 become uniform in the same area, and thus charging or replacement of the sensor devices 4 may be made all at once in each area, and the operational management cost is reduced. FIG. 3 illustrates a configuration in which multiple sensor devices 4 and the gateway 5 are arranged in each of areas 8A, 8B, and 8C.

For instance, in the same area, the management server 7 sets the frequency of collection of observational data less in volume than a reference value from a sensor device 4 to be lower than the frequency of collection of observational data greater in volume than a reference value from a sensor device 4. Or, in the same area, the management server 7 sets the frequency of collection of observational data greater in volume than a reference value from a sensor device 4 to be higher than the frequency of collection of observational data less in volume than a reference value from a sensor device 4.

The management server 7 transmits a data transmission request signal to the gateway 5 in each area via the network 6. The gateway 5 in each area obtains information from each of the sensor devices 4 in the same area as the area of itself, and uploads the obtained information to the management server 7 via the network 6.

Noted that transmission and reception of information between the sensor devices 4 and the gateway 5 are performed by wireless communication, however, may be performed by wired communication. Also, transmission and reception of information between the gateway 5 and the network 6 are performed by wired communication, however, may be performed by wireless communication. Also, the gateway 5 that manages each sensor network may have part of the management function of the management server 7, and the battery remaining amount management system 1000 may serve as a distributed management system.

Next, the calculation processing for the battery remaining amount will be described.

Figure 5:
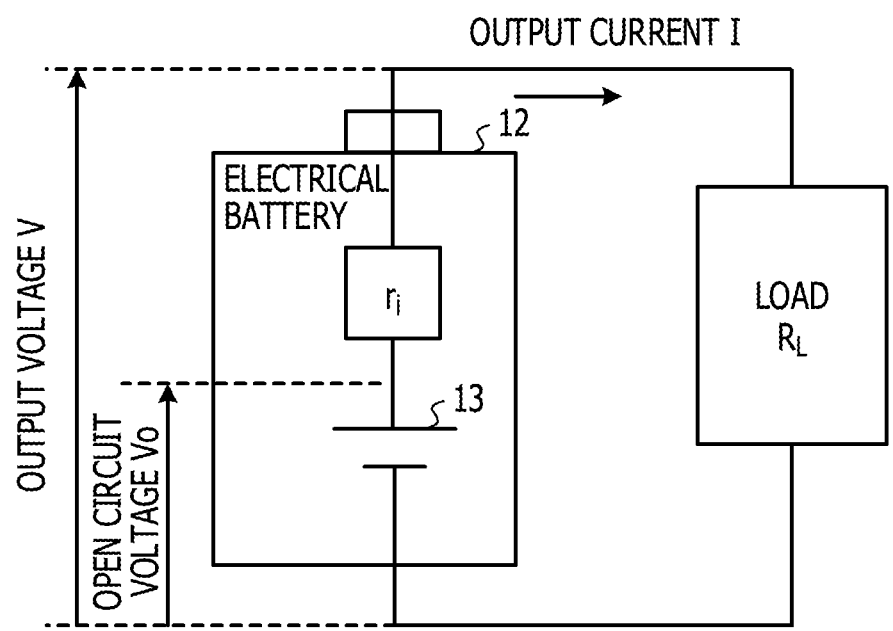
FIG. 5 is a circuit diagram schematically illustrating an example internal configuration of a battery.

FIG. 5 is a circuit diagram schematically illustrating an example internal configuration of a battery. The battery 12 may be represented by an equivalent circuit in which a voltage source 13 and an internal impedance $r_i$ are connected in series. A load $R_L$ includes the control circuit 20, the sensor 16, and the communication device 18. A one-on-one correlation is present between the voltage (open circuit voltage Vo) of the voltage source 13 and a state of charge (SOC) which represents the remaining amount of the battery 12, thus it is possible to estimate the remaining amount of the battery 12 by measuring the open circuit voltage Vo.

The output voltage V of the battery 12 is equal to the sum of the open circuit voltage Vo and the product of the internal impedance $r_i$ of the battery 12 and an output current I of the battery 12 ($V=r_i \times I+Vo$). Therefore, the open circuit voltage Vo may be calculated as the unvarying voltage component of the output voltage V when the output current I is changed. In other words, when the internal impedance $r_i$ is measurable, it is possible to calculate the open circuit voltage Vo by applying a known current change to the battery 12.

Figure 6:
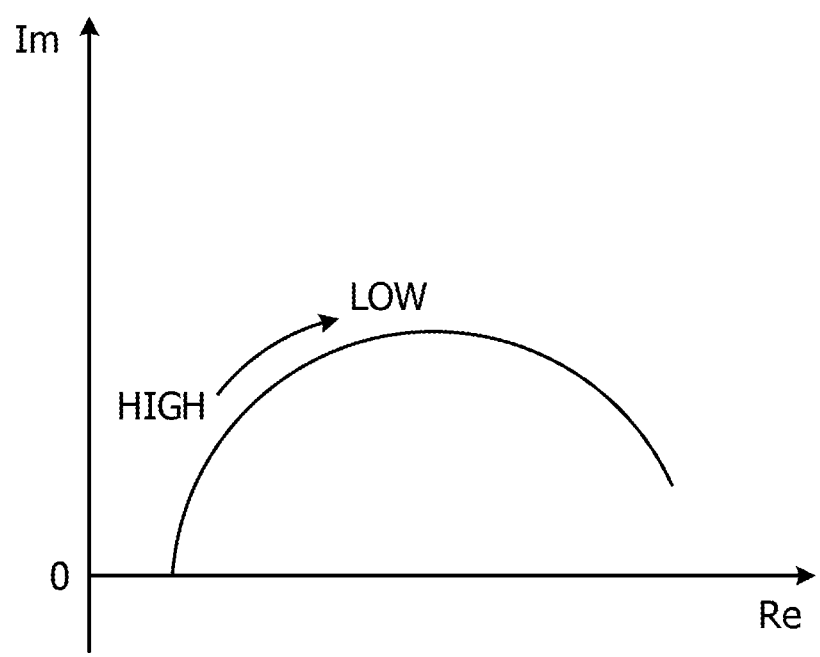
FIG. 6 is a Nyquist diagram illustrating example data obtained when the internal impedance of a battery is measured by an electrochemical impedance measurement method.

FIG. 6 is a Nyquist diagram illustrating example data obtained when the internal impedance of a battery is measured by an electrochemical impedance measurement method. The Nyquist diagram is also referred to as a Cole-Cole plot diagram. The real number component of the internal impedance is plotted on the horizontal axis Re, and the imaginary number component is plotted on the vertical axis Im. When data obtained by varying the frequency of the output current I is plotted on a complex plane, a semicircle as illustrated is drawn. The impedance measurement unit 52 (see FIG. 4) estimates a low frequency component (that is, the direct current internal impedance $r_i$) for which observation is normally time-consuming, by performing fitting processing on the obtained data.

Figure 7:
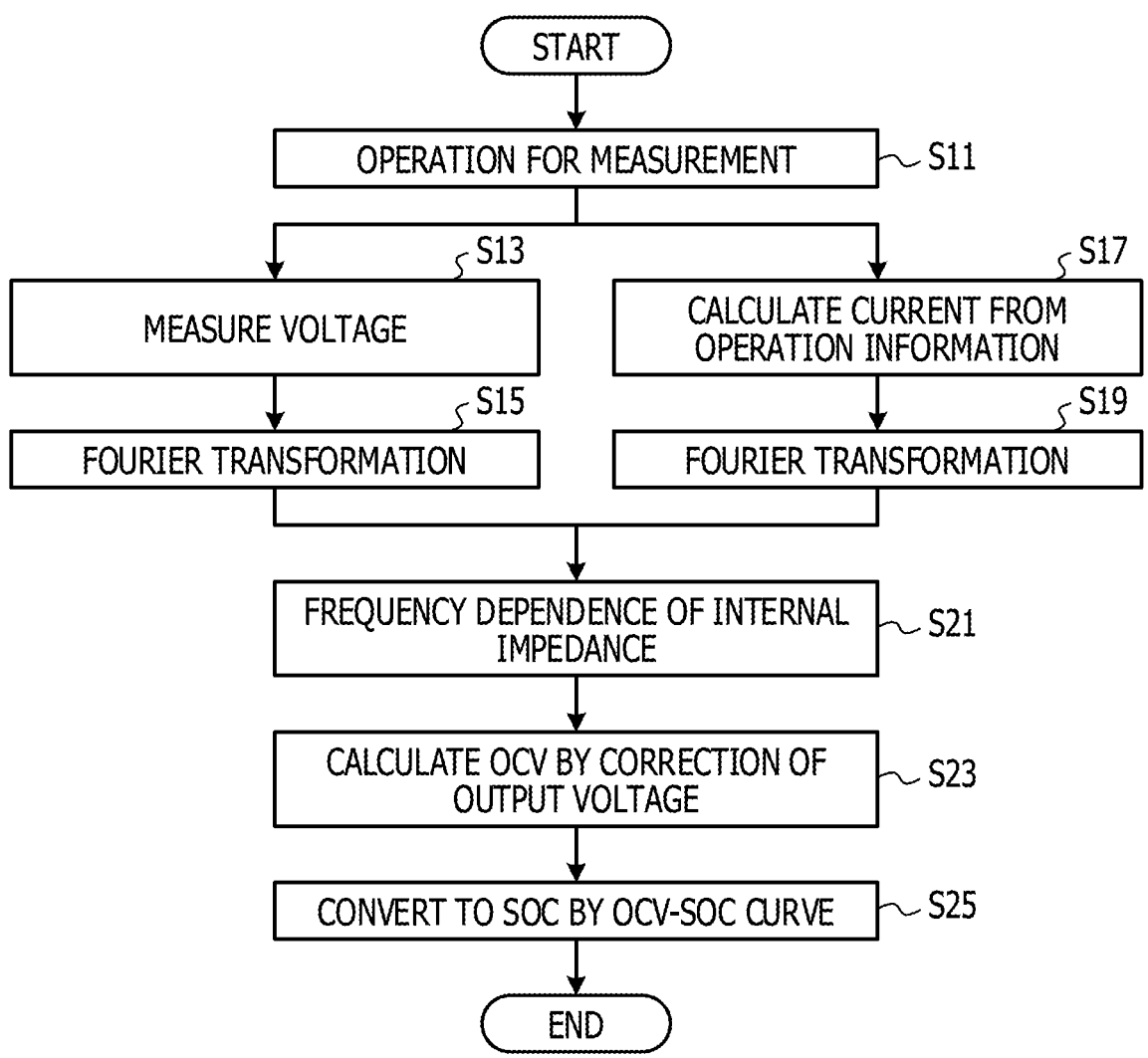
FIG. 7 is a flowchart illustrating an example method of measuring the remaining amount of a battery using the internal impedance measured by an electrochemical impedance measurement method.

FIG. 7 is a flowchart illustrating an example method of measuring the remaining amount of a battery using the internal impedance measured by an electrochemical impedance measurement method. FIG. 7 will be described with reference to the functional configuration diagram of FIG. 4.

As described above, when the internal impedance $r_i$ is measurable, it is possible for the remaining amount calculation unit 53 to calculate the open circuit voltage Vo by applying a known current change to the battery 12. The internal impedance $r_i$ is measurable via the impedance measurement unit 52 by an electrochemical impedance measurement method. Thus, in a battery remaining amount calculation method in the first embodiment, the operation control unit 51 applies a known current change to the battery 12 in order to calculate the open circuit voltage Vo.

In step S11, the operation control unit 51 operates the control circuit 20 with a specific operating current which changes the output current I of the battery 12. Specifically, the operation control unit 51 causes the control circuit 20 to operate a specific operation for measurement to generate a specific operating current which changes the output current I. The control circuit 20 performs a specific operation for measurement, thereby making it possible to grasp how the output current I of the battery 12 changes in advance on a design basis. Therefore, the operation control unit 51 may apply a known current change to the battery 12 by causing the control circuit 20 to perform a predetermined specific operation for measurement.

In step S13, in a period during which the operation control unit 51 is generating a specific operating current, the output voltage V of the battery 12 is measured by the voltage measurement unit 21. In step S15, the impedance measurement unit 52 performs Fourier transformation on the output voltage V measured in step S13.

On the other hand, in step S17, the impedance measurement unit 52 calculates the output current I generated in the battery 12 based on information on the specific operation for measurement performed by the control circuit 20 in step S11. The current value of the output current I may be incorporated in the remaining amount calculation processing program 25, or may be pre-stored in the data storage memory 24. In step S19, the impedance measurement unit 52 performs Fourier transformation on the output current I calculated in step S17.

In step S21, the impedance measurement unit 52 performs fitting processing based on the result of Fourier transformation of the output voltage V and the result of Fourier transform of the output current I, and thereby derives the frequency dependence of the internal impedance of the battery 12, and calculates the internal impedance $r_i$. In short, the impedance measurement unit 52 measures the internal impedance $r_i$ by an electrochemical impedance measurement method.

In step S23, the remaining amount calculation unit 53 calculates an open circuit voltage Vo (OCV) by correction of the output voltage V. The remaining amount calculation unit 53 calculates the OCV Vo in accordance with the relationship of "Vo=V−$r_i$×I" using the voltage value of the output voltage V measured in step S13, the current value of the output current I calculated in step S17, and the internal impedance $r_i$ measured in step S21.

In step S25, the remaining amount calculation unit 53 converts the OCV Vo calculated in step S23 to an SOC based on correlation data which indicates a correlation curve with SOC. Specifically, the remaining amount calculation unit 53 calculates the remaining amount of the battery 12, which corresponds to the OCV Vo calculated in step S23, based on correlation data which indicates a correlation curve with SOC.

Figure 8:
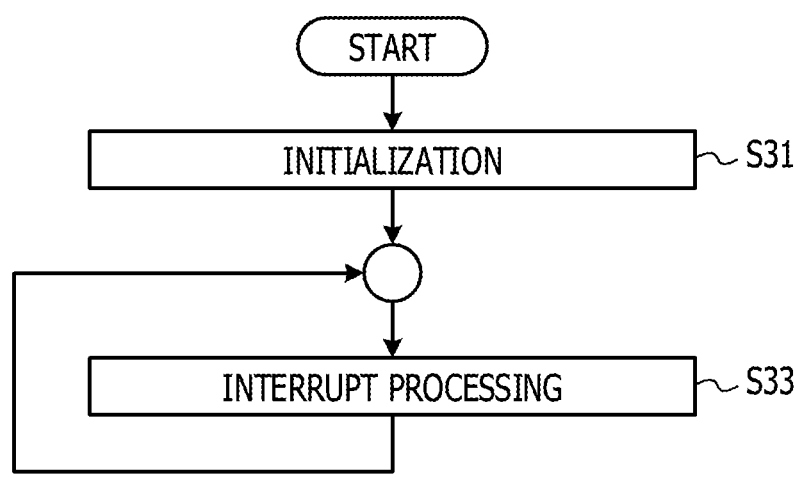
FIG. 8 is a flowchart illustrating an example flow of an interrupt operation of a sensor device.

FIG. 8 is a flowchart illustrating an example flow of an interrupt operation of a sensor device. In step S31, the control circuit 20 of the sensor device performs predetermined initialization processing after power source reset is released. The control circuit 20 performs interrupt processing for each interrupt timing (step S33).

Figure 9:
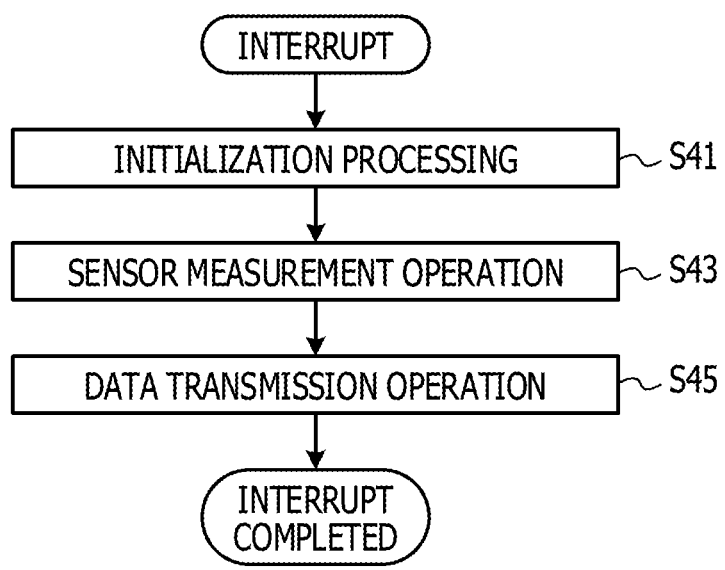
FIG. 9 is a flowchart illustrating the flow of sensor operation interrupt processing in a first operation example of the sensor device in the first embodiment.

FIG. 9 is a flowchart illustrating the flow of sensor operation interrupt processing in a first operation example of the sensor device in the first embodiment. When an interrupt in step S33 of FIG. 8 occurs, the sensor control unit 54 of the control circuit 20 performs initialization processing before a sensing operation of obtaining observational data from the sensor 16 is performed (step S41). In step S43, the sensor control unit 54 performs the sensing operation of obtaining the observational data detected by the sensor 16 from the sensor 16. In step S45, the sensor control unit 54 transmits the observational data obtained from the sensor 16 by the sensing operation to the management server 7 via the communication device 18. After transmission of the observational data, the interrupt processing of the sensing operation is completed.

Figure 10:
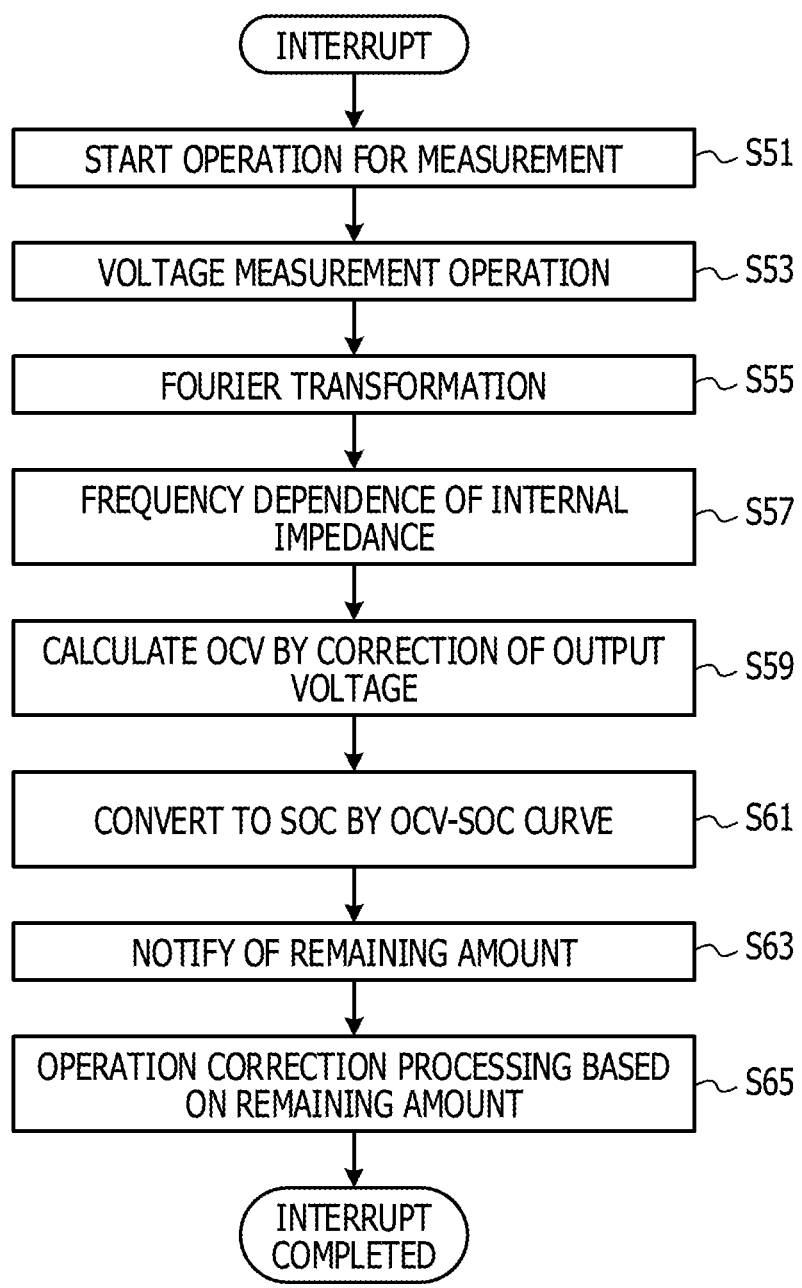
FIG. 10 is a flowchart illustrating the flow of battery remaining amount measurement interrupt processing in the first operation example of the sensor device in the first embodiment.

FIG. 10 is a flowchart illustrating the flow of battery remaining amount measurement interrupt processing in the first operation example of the sensor device in the first embodiment. When an interrupt in step S33 of FIG. 8 occurs, the operation control unit 51 of the control circuit 20 starts to cause the control circuit 20 to perform a specific operation for measurement to generate a specific operating current which changes the output current I (step S51). In step S53, in a period during which the operation control unit 51 is generating a specific operating current, the output voltage V of the battery 12 is measured by the voltage measurement unit 21. In step S55, the impedance measurement unit 52 performs Fourier transformation on the output voltage V measured in step S13.

In step S57, the impedance measurement unit 52 performs fitting processing based on the result of Fourier transformation of the output voltage V and the result of Fourier transform of the output current I, and thereby derives the frequency dependence of the internal impedance of the battery 12, and calculates the internal impedance $r_i$. Although not clearly illustrated in FIG. 10, calculation of the output current I and Fourier transformation of the output current I are performed in the same manner as in steps S17 and S19 of FIG. 7.

The processing in steps S59 and S61 is the same as the processing in steps S23 and S25 of FIG. 7, thus a description thereof is omitted.

In step S63, the sensor control unit 54 transmits via the communication device 18 the remaining amount data of the battery 12 calculated in step S61 to the management server 7 that manages the battery remaining amount. In step S65, the sensor control unit 54 performs operation correction processing based on the remaining amount data of the battery 12 calculated in step S61, the operation correction processing for changing the frequency of performing an operation to reduce the remaining amount of the battery 12. Consequently, it is possible to efficiently consume the remaining amount of the battery 12. For instance, the sensor control unit 54 reduces the frequency of performing an operation to reduce the remaining amount of the battery 12 as the remaining amount data of the battery 12 decreases. Consequently, a decrease rate of the remaining amount of the battery 12 is reduced, and thus it is possible to extend the operation hours of the sensor device even when the remaining amount of the battery 12 is relatively low.

Figure 11:
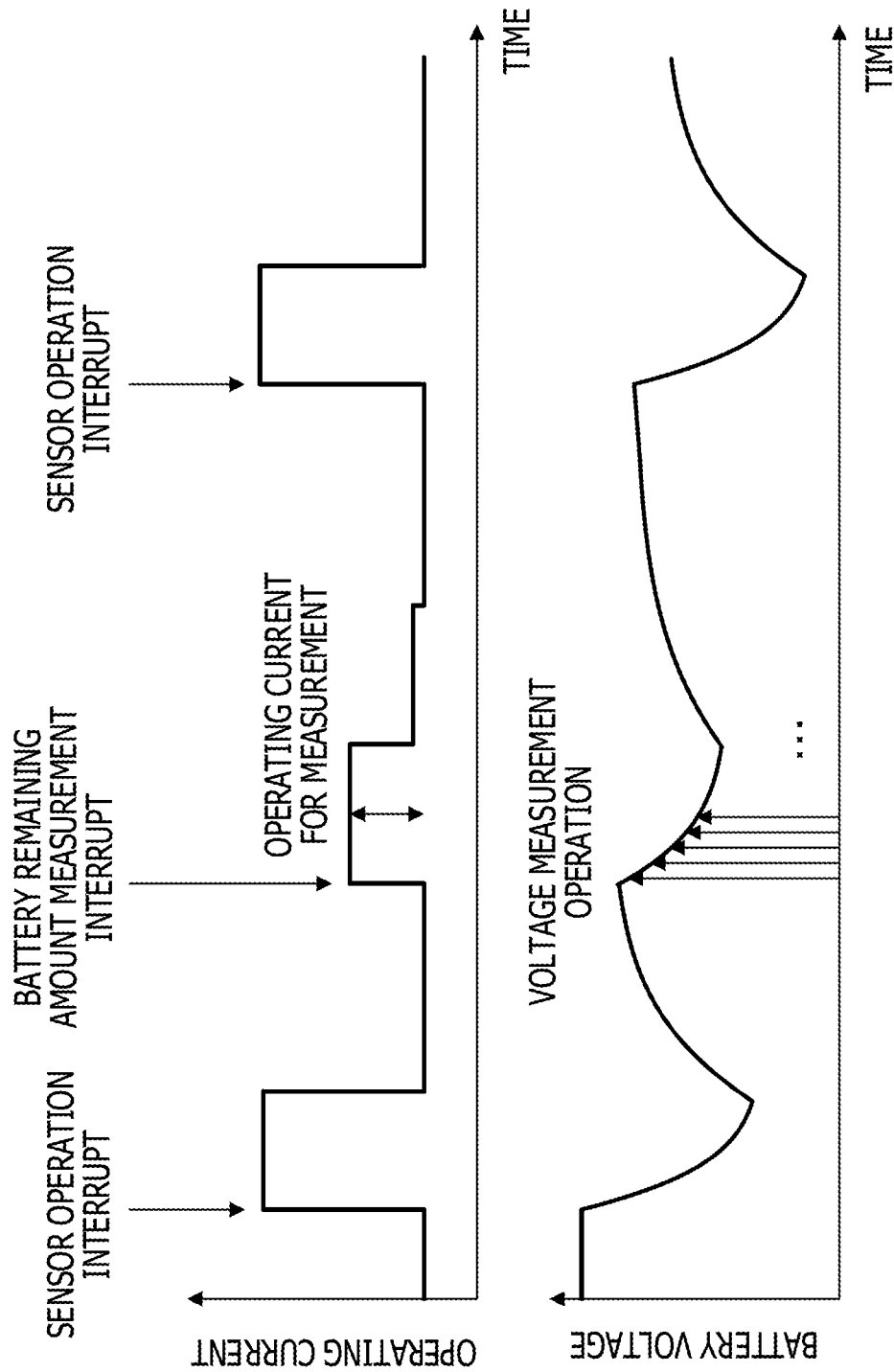
FIG. 11 is a timing chart illustrating the sensor operation interrupt processing and the battery remaining amount measurement interrupt processing in the first operation example of the sensor device.

FIG. 11 is a timing chart illustrating the sensor operation interrupt processing (FIG. 9) and the battery remaining amount measurement interrupt processing (FIG. 10) in the first operation example of the sensor device. In a period during which the sensor 16 utilizing the battery 12 as the power source is not used, the operation control unit 51 causes the control circuit 20 to perform a specific operation for measurement to generate an operating current (operating current for measurement) having a specific current waveform, which changes the output current I.

When the sensor control unit 54 performs the sensing operation of obtaining the observational data detected by the sensor 16 from the sensor 16 (see step S43 in FIG. 9), the operating current of the control circuit 20 is increased by an amount corresponding to the current used in the sensing operation. In a period during which the sensor control unit 54 is performing the sensing operation, the output current I of the battery 12 is also increased, thus the output voltage V of the battery 12 is decreased. When the sensing operation is completed, the increase in the current of the control circuit 20 due to the sensing operation no longer occurs, and the output voltage V of battery 12 starts to increase.

When the operation control unit 51 causes the control circuit 20 to perform a specific operation for measurement to generate a specific operating current which changes the output current I (see step S51 in FIG. 10), the operating current of the control circuit 20 is increased by an amount corresponding to the current used in the operation for measurement. In a period during which the control circuit 20 is performing the operation for measurement, the output current I of the battery 12 is also increased, thus the output voltage V of the battery 12 is decreased. In a period during which the operation control unit 51 causes the control circuit 20 to perform a specific operation for measurement, the output voltage V of the battery 12 is measured by the voltage measurement unit 21 (see step S53 in FIG. 10).

In this manner, in a period during which the sensing operation is not performed, the operation control unit 51 causes the control circuit 20 to perform a specific operation for measurement to generate an operating current having a specific current waveform, which changes the output current I. Thus, it is possible to avoid having an effect on the measurement of the output voltage V used for calculation of the battery remaining amount by the change in the output voltage V due to the sensing operation.

Figure 12:
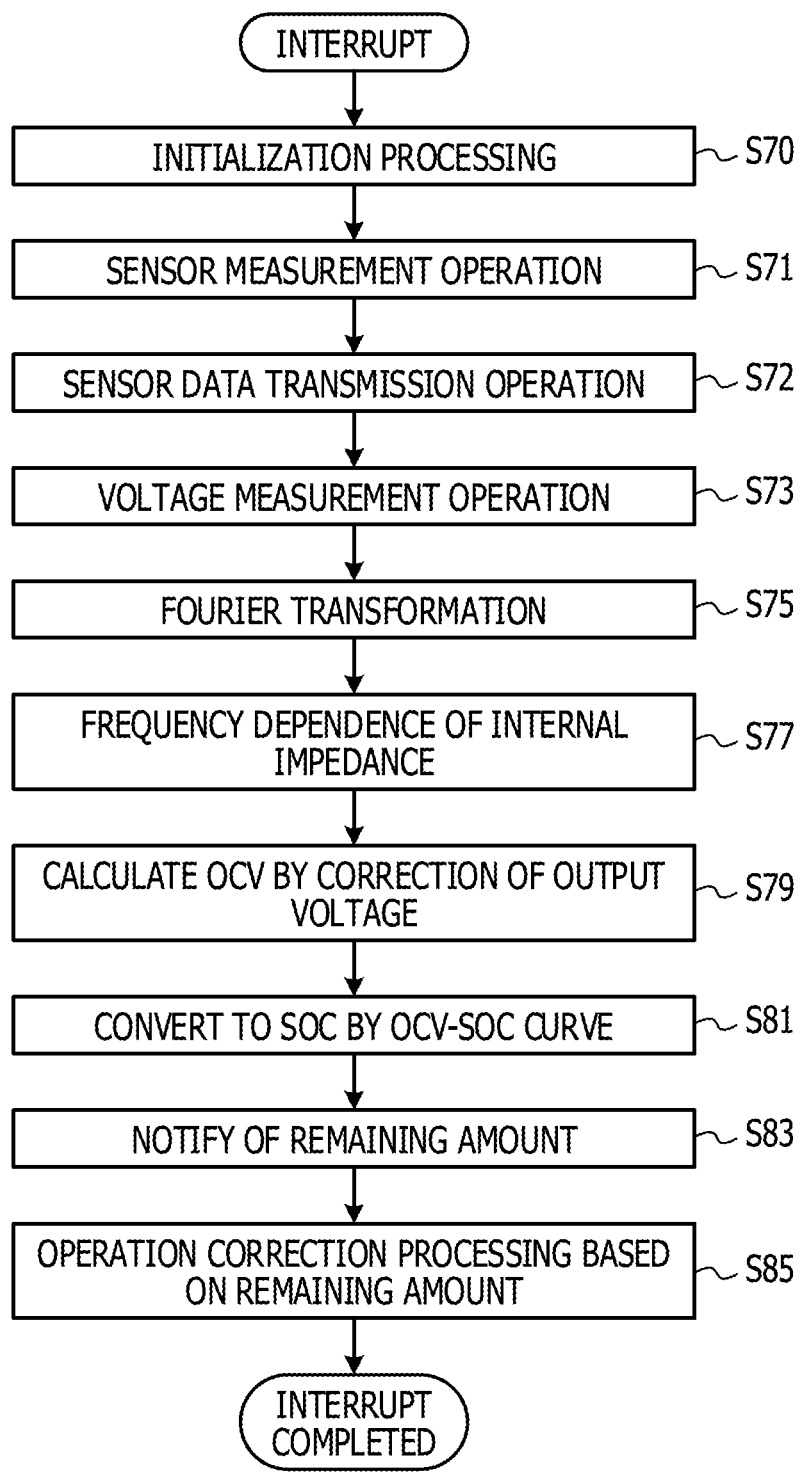
FIG. 12 is a flowchart illustrating the flow of interrupt processing in a second operation example of the sensor device in the first embodiment.

FIG. 12 is a flowchart illustrating the flow of interrupt processing in a second operation example of the sensor device in the first embodiment. The first operation example of FIG. 10 illustrates the case where a voltage measurement operation is performed in interrupt processing other than the sensing operation illustrated in FIG. 9. In contrast, the second operation example of FIG. 12 illustrates the case where a sensing operation and a voltage measurement operation are performed in the same interrupt processing.

Also, the first operation example of FIG. 10 illustrates the case where, in a period during which the sensor 16 is not used, the operation control unit 51 operates the control circuit 20 with a specific operating current. In contrast, the second operation example of FIG. 12 illustrates the case where, in a period during which the sensor 16 is used, the operation control unit 51 operates the control circuit 20 with a specific operating current. If the manner in which the operating current of the control circuit 20 changes in a period when the sensor 16 is used is known in advance, the sensing operation itself may be treated as a specific operation for measurement to generate a specific operating current which changes the output current I.

When an interrupt in step S33 of FIG. 8 occurs, in FIG. 12, the sensor control unit 54 performs initialization processing before a sensing operation of obtaining observational data from the sensor 16 (step S70). In step S71, the operation control unit 51 causes the sensor control unit 54 to perform a sensing operation to generate a specific operating current which changes the output current I. A command from the operation control unit 51 causes the sensor control unit 54 to perform a sensing operation of obtaining the observational data detected by the sensor 16 from the sensor 16. In step S72, the sensor control unit 54 transmits the observational data obtained from the sensor 16 by the sensing operation to the management server 7 via the communication device 18. Noted that transmission of the observational data may be performed at any timing between step S73 and the interrupt completion of FIG. 12 inclusive.

In step S73, in a period during which the operation control unit 51 is generating a specific operating current (in a period during which the sensor control unit 54 is performing a sensing operation), the output voltage V of battery 12 is measured by the voltage measurement unit 21.

The processing in steps S75 to S85 is the same as the processing in steps S55 to S65 of FIG. 10, thus a description thereof is omitted.

Figure 13:
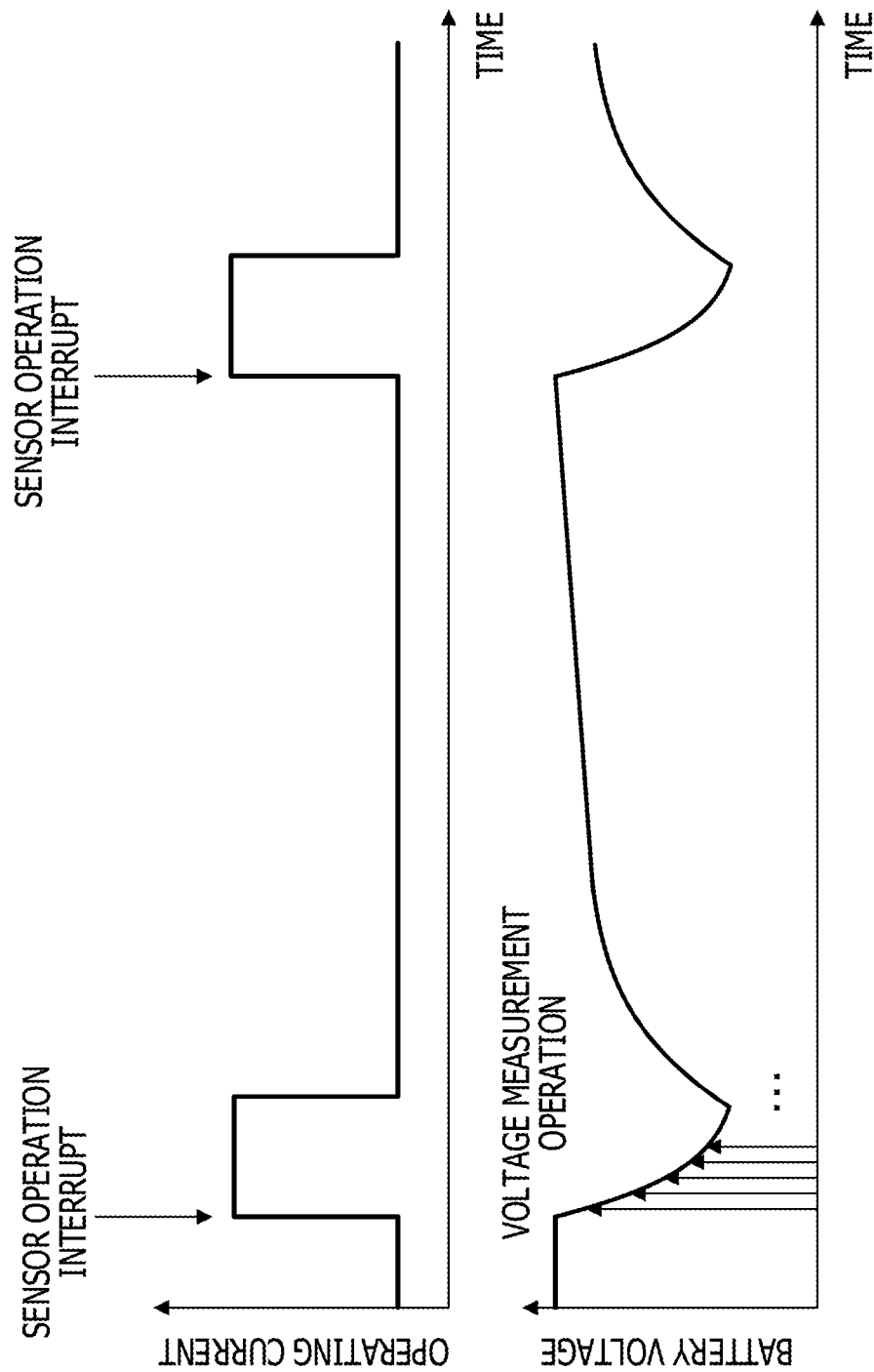
FIG. 13 is a timing chart illustrating sensor operation interrupt processing in the second operation example of the sensor device.

FIG. 13 is a timing chart illustrating sensor operation interrupt processing (FIG. 12) in the second operation example of the sensor device in the second embodiment. In a period during which the sensor 16 utilizing the battery 12 as the power source is used, the operation control unit 51 causes the sensor control unit 54 of the control circuit 20 to perform a specific operation for measurement (in this case, a sensing operation) to generate an operating current having a specific current waveform, which changes the output current I. In a period during which the operation control unit 51 causes the sensor control unit 54 of the control circuit 20 to perform a sensing operation, the output voltage V of the battery 12 is measured by the voltage measurement unit 21 (see step S73 in FIG. 12).

In this manner, in a period during which the sensing operation is performed, the operation control unit 51 causes the sensor control unit 54 of the control circuit 20 to perform a specific sensing operation to generate an operating current having a specific current waveform, which changes the output current I. Accordingly, the operating current having a specific current waveform may be passed utilizing the sensing operation. Thus, it is possible to measure the output voltage V used for measurement of the internal impedance without generating an operating current for measurement (see FIG. 11), and thus the control processing of the control circuit 20 may be simplified.

Therefore, according to the first embodiment, it is possible to omit a current source for measurement of the internal impedance and a sample hold circuit. Consequently, it is possible to reduce the power of the sensor device consumed for measurement of the battery remaining amount, as compared with a sensor device in related art. In addition, even when the output current I is not actually measured, performing a specific operation for measurement allows the output current I to be estimated, and thus a measurement circuit of the output current I may be omitted. Thus, a circuit that concurrently measures the output current and the output voltage of the battery may also be omitted, and part of the details of calculation processing in the control circuit 20 may be omitted.

Also, in the example illustrated in FIGS. 11 and 13, the operation control unit 51 causes the control circuit 20 to operate so that a rectangular wave current or a current in combination of rectangular wave currents is generated as the specific operating current. The rectangular wave current includes a frequency component of an odd multiple of a repetitive frequency other than a repetitive frequency of a rectangular wave, thus the effect as if measurement of multiple frequencies are simultaneously made is obtained. Therefore, the impedance measurement unit 52 may omit part of the fitting processing that measures a frequency distribution of the internal impedance.

Figure 14:
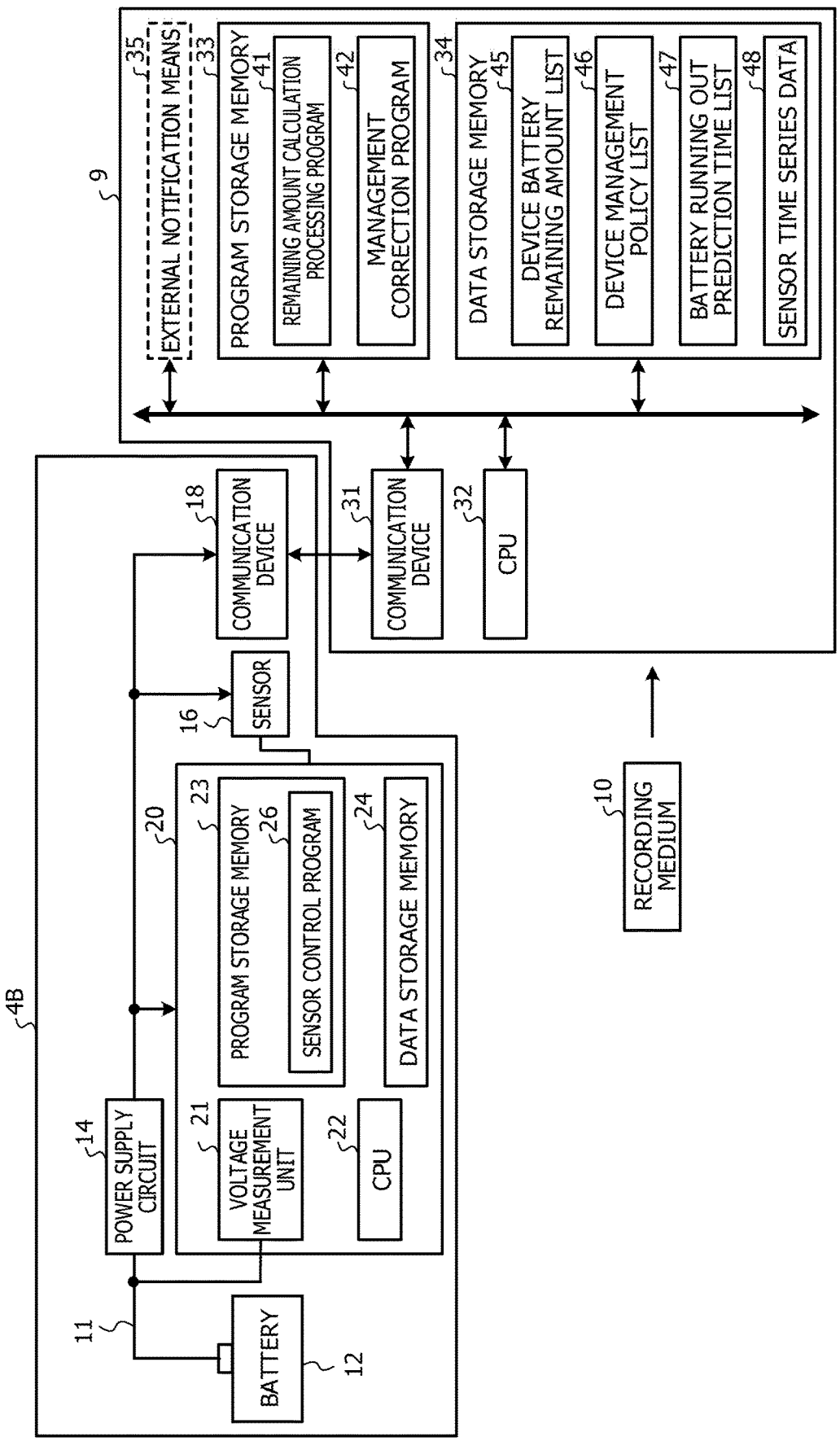
FIG. 14 is a diagram illustrating an example hardware configuration of a battery remaining amount management system in the second embodiment.

FIG. 14 is a diagram illustrating an example hardware configuration of a battery remaining amount management system in the second embodiment. A sensor device 4B is an example of the sensor device 4 (see FIG. 3), and a processing device 9 is an example of the management server 7 (see FIG. 3). An explanation of the configuration and the effect of the second embodiment which are the same as those in the first embodiment will be omitted or simplified by using the above-described explanation.

In the first embodiment illustrated in FIG. 2, remaining amount calculation for the battery 12 is performed on the side of the sensor device including the battery 12. In contrast, in the second embodiment illustrated in FIG. 14, remaining amount calculation for the battery 12 of each of the sensor devices is performed on the side of the management server 7. A remaining amount calculation processing program 41 is stored not in the sensor device 4B but in the program storage memory 33 of the management server 7.

The processing device 9 includes a communication device 31, a CPU 32, a program storage memory 33, a data storage memory 34, and an external notification unit 35.

The CPU 32 is an example of a processor that operates in accordance with a program stored in a memory. At least one program that defines the steps to be executed by the CPU 32 is stored in the program storage memory 33. In the embodiment, a remaining amount calculation processing program 41 that defines the processing steps for calculating the remaining amount of the battery 12, and a management correction program 42 that defines the processing steps for correcting the management of the battery 12 are stored in the program storage memory 33. The data storage memory 34 stores data referred to by the CPU 32 that operates in accordance with a program, and data obtained by the CPU 32 operating in accordance with a program.

At least one program stored in the program storage memory 33 may be provided by a recording medium 10, for instance. When the recording medium 10, on which at least one program is recorded, is set to the processing device 9, the program is installed from the recording medium 10 to the program storage memory 33.

The data storage memory 34 stores a device battery remaining amount list 45, a device management policy list 46, a battery running out prediction time list 47, and a sensor time series data 48. The device battery remaining amount list 45 includes identification information of each sensor device 4, and the remaining amount data of the battery 12 of each sensor device 4. The sensor time series data 48 includes identification information of each sensor device 4, and observational data detected by the sensor 16 of each sensor device 4. The device management policy list 46 and the battery running out prediction time list 47 will be described later.

The communication device 31 has a modulation processing unit that performs modulation processing at the time of transmission, and a demodulation processing unit that performs demodulation processing at the time of reception. The communication device 31 communicates with the sensor device 4B or the gateway 5.

The external notification unit 35 notifies outside of the processing device 9 of information for setting of administrator information and browsing of sensor data. The external notification unit 35 may include a communication device or a display device dedicated for the external notification unit 35, or may notify of information via the communication device 31.

In the second embodiment, the impedance measurement unit 52 and the remaining amount calculation unit 53 are not on the side of the sensor device 4, but are functional units on the side of the processing device 9.

Figure 15:
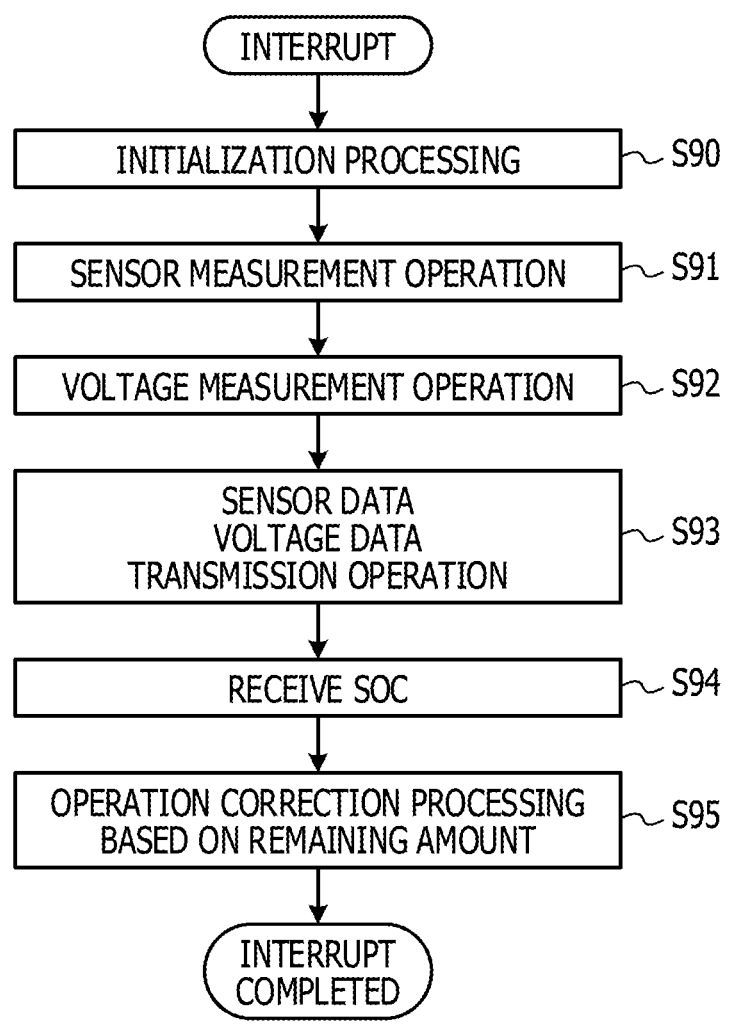
FIG. 15 is a flowchart illustrating the flow of interrupt processing in a third operation example of a sensor device in the second embodiment.

FIG. 15 is a flowchart illustrating the flow of interrupt processing in a third operation example of the sensor device in the second embodiment. FIG. 15 illustrates a method in which a voltage measurement operation is performed in the same period as that of a sensing operation utilizing the current in a sensing operation as in the timing chart illustrated in FIG. 13.

When an interrupt in step S33 of FIG. 8 occurs, in FIG. 15, the sensor control unit 54 performs initialization processing before a sensing operation of obtaining observational data from the sensor 16 (step S90). In step S91, the operation control unit 51 causes the sensor control unit 54 to perform a sensing operation to generate a specific operating current which changes the output current I. A command from the operation control unit 51 causes the sensor control unit 54 to perform a sensing operation of obtaining the observational data detected by the sensor 16 from the sensor 16.

In step S92, in a period during which the operation control unit 51 is generating a specific operating current (in a period during which the sensor control unit 54 is performing a sensing operation), the output voltage V of battery 12 is measured by the voltage measurement unit 21.

In step S93, the sensor control unit 54 transmits the observational data obtained from the sensor 16 by a sensing operation, and the output voltage V measured in a period during which the sensing operation is performed to the processing device 9 via the communication device 18.

The impedance measurement unit of the processing device 9 performs Fourier transformation on the output voltage V transmitted in step S93. The impedance measurement unit of the processing device 9 performs fitting processing based on the result of Fourier transformation of the output voltage V and the result of Fourier transform of the output current I, and thereby derives the frequency dependence of the internal impedance of the battery 12, and calculates the internal impedance $r_i$. Noted that calculation of the output current I and Fourier transformation of the output current I are performed in the same manner as in steps S17 and S19 of FIG. 7. The calculation of an OCV Vo and an SOC indicating the remaining amount is the same as the processing in steps S23 and S25 of FIG. 7, thus a description thereof is omitted.

The remaining amount calculation unit of the processing device 9 transmits the calculated SOC indicating the remaining amount to a sensor device via the communication device 31, the sensor device including the battery for which the remaining amount has been calculated.

In step S94 of FIG. 15, the control circuit 20 obtains SOC data received via the communication device 18. In step S95, the sensor control unit 54 performs operation correction processing based on the remaining amount data of the battery 12 received in step S94, the operation correction processing for changing the frequency of performing an operation to reduce the remaining amount of the battery 12. Consequently, it is possible to efficiently consume the remaining amount of the battery 12.

Figure 16:
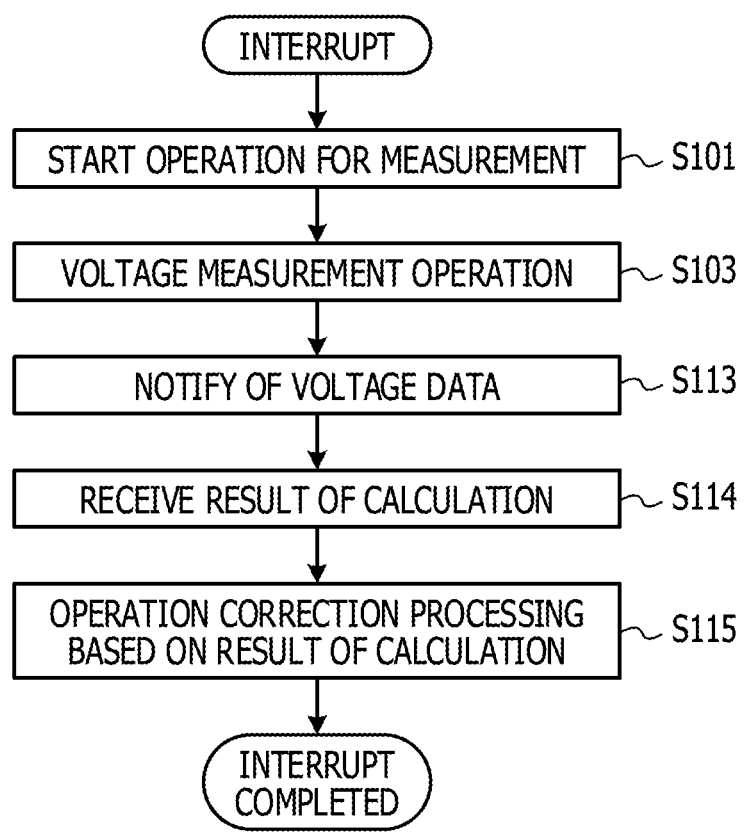
FIG. 16 is a flowchart illustrating the flow of interrupt processing in a fourth operation example of the sensor device in the second embodiment.

FIG. 16 is a flowchart illustrating the flow of interrupt processing in a fourth operation example of the sensor device in the second embodiment. FIG. 16 illustrates a method of performing a voltage measurement operation utilizing the current in a sensing operation as in the timing chart illustrated in FIG. 11.

When an interrupt in step S33 of FIG. 8 occurs, in FIG. 16, the operation control unit 51 starts to cause the control circuit 20 to perform a specific operation for measurement to generate a specific operating current which changes the output current I (step S101). In step S103, in a period during which the operation control unit 51 is generating a specific operating current, the output voltage V of the battery 12 is measured by the voltage measurement unit 21.

In step S113, the sensor control unit 54 transmits the output voltage V to the processing device 9 via the communication device 18, the output voltage V being measured in a period during which a specific operation for measurement is performed.

The impedance measurement unit of the processing device 9 performs Fourier transformation on the output voltage V transmitted in step S113. The impedance measurement unit of the processing device 9 performs fitting processing based on the result of Fourier transformation of the output voltage V and the result of Fourier transform of the output current I, and thereby derives the frequency dependence of the internal impedance of the battery 12, and calculates the internal impedance $r_i$. Noted that calculation of the output current I and Fourier transformation of the output current I are performed in the same manner as in steps S17 and S19 of FIG. 7. The calculation of an OCV Vo and an SOC indicating the remaining amount is the same as the processing in steps S23 and S25 of FIG. 7, thus a description thereof is omitted.

The result of calculation of the remaining amount or the result of calculation performed by the processing device 9 based on the result of calculation of the remaining amount are transmitted by the communication device 31 to the sensor device including the battery for which the remaining amount has been calculated.

In step S114, the communication device 18 receives the result of calculation of the remaining amount or the result of calculation performed by the processing device 9 based on the result of calculation of the remaining amount. In step S115, the sensor control unit 54 performs operation correction processing based on the result of calculation of the remaining amount or the result of calculation performed by the processing device 9 based on the result of calculation of the remaining amount, the operation correction processing for changing the frequency of performing an operation to reduce the remaining amount of the battery 12. Consequently, it is possible to efficiently consume the remaining amount of the battery 12.

Therefore, according to the second embodiment, it is possible to reduce the power of the sensor device consumed for measurement of the battery remaining amount by leaving the calculation processing for the remaining amount of the battery 12 to the processing device 9. Also, when an advanced remaining amount estimation method or error correction method are devised later, the firmware of the sensor device does not have to be corrected by taking measures for only changing the calculation processing of the processing device 9.

Next, the operation correction processing will be described.

Figure 17:
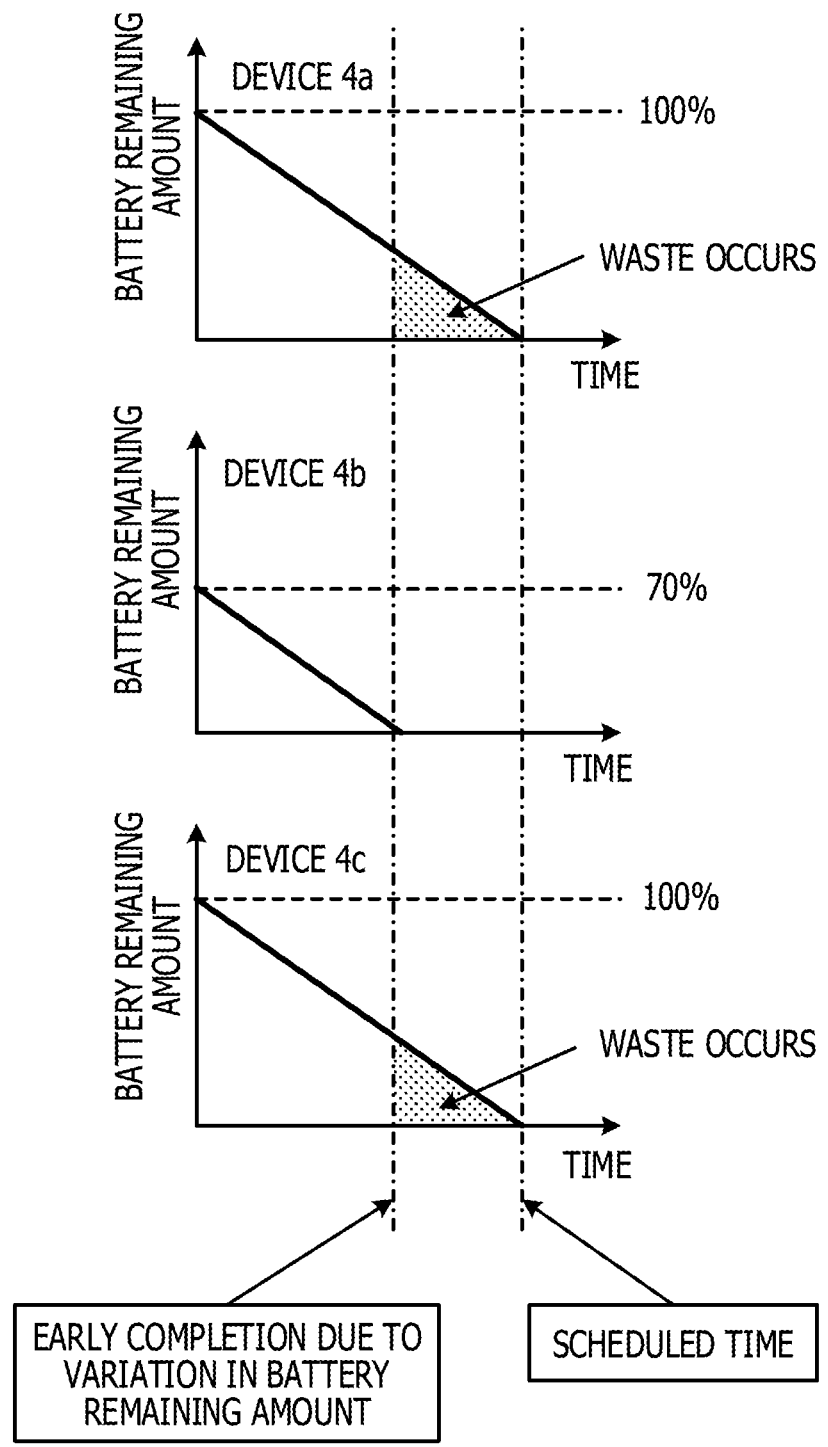
FIG. 17 depicts graphs illustrating an example when operation correction processing is not performed.

FIG. 17 depicts graphs illustrating an example when the operation correction processing is not performed. FIG. 17 illustrates a temporal change in the remaining amount of the battery of each of three sensor devices 4a, 4b, and 4c.

The remaining amounts of the batteries of the sensor devices run out substantially at the same, works of replacement of the batteries of the sensor devices may be collectively performed, and thus the efficiency of the works of replacement increases. However, when the battery remaining amounts of the sensor devices 4a to 4c are varied as illustrated in FIG. 17, a variation occurs in scheduled times when the sensor devices are no longer in operation due to decrease in the battery remaining amount. Therefore, if all the batteries of the sensor devices 4a to 4c are replaced at the timing when the sensor device 4b is no longer in operation, the batteries of the sensor devices 4a, 4c each still have a remaining amount, and thus waste occurs.

Figure 18:
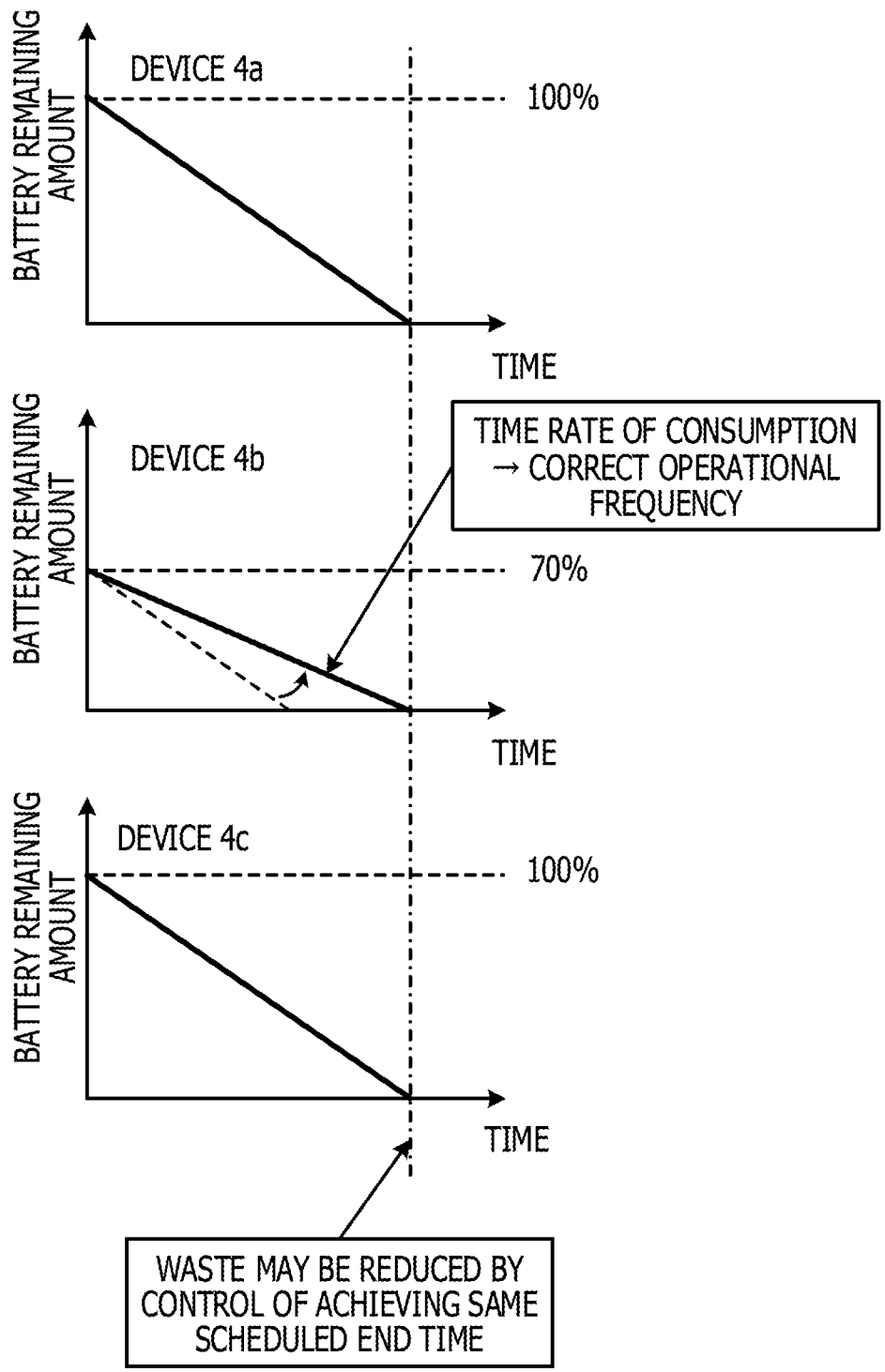
FIG. 18 depicts graphs illustrating an example when operation correction processing is performed for achieving substantially the same scheduled completion time between multiple sensor devices.

Thus, as illustrated in FIG. 18, the sensor control unit 54 performs the operation correction processing for changing the frequency of performing an operation to reduce the remaining amount of the battery 12 according to the remaining amount of the battery 12 so that scheduled end times are substantially the same between the multiple sensor devices. Consequently, the times when the remaining amounts of the batteries are used up may be made uniform between the multiple sensor devices, thus it is possible to reduce occurrence of waste of the battery remaining amount.

Figure 19:
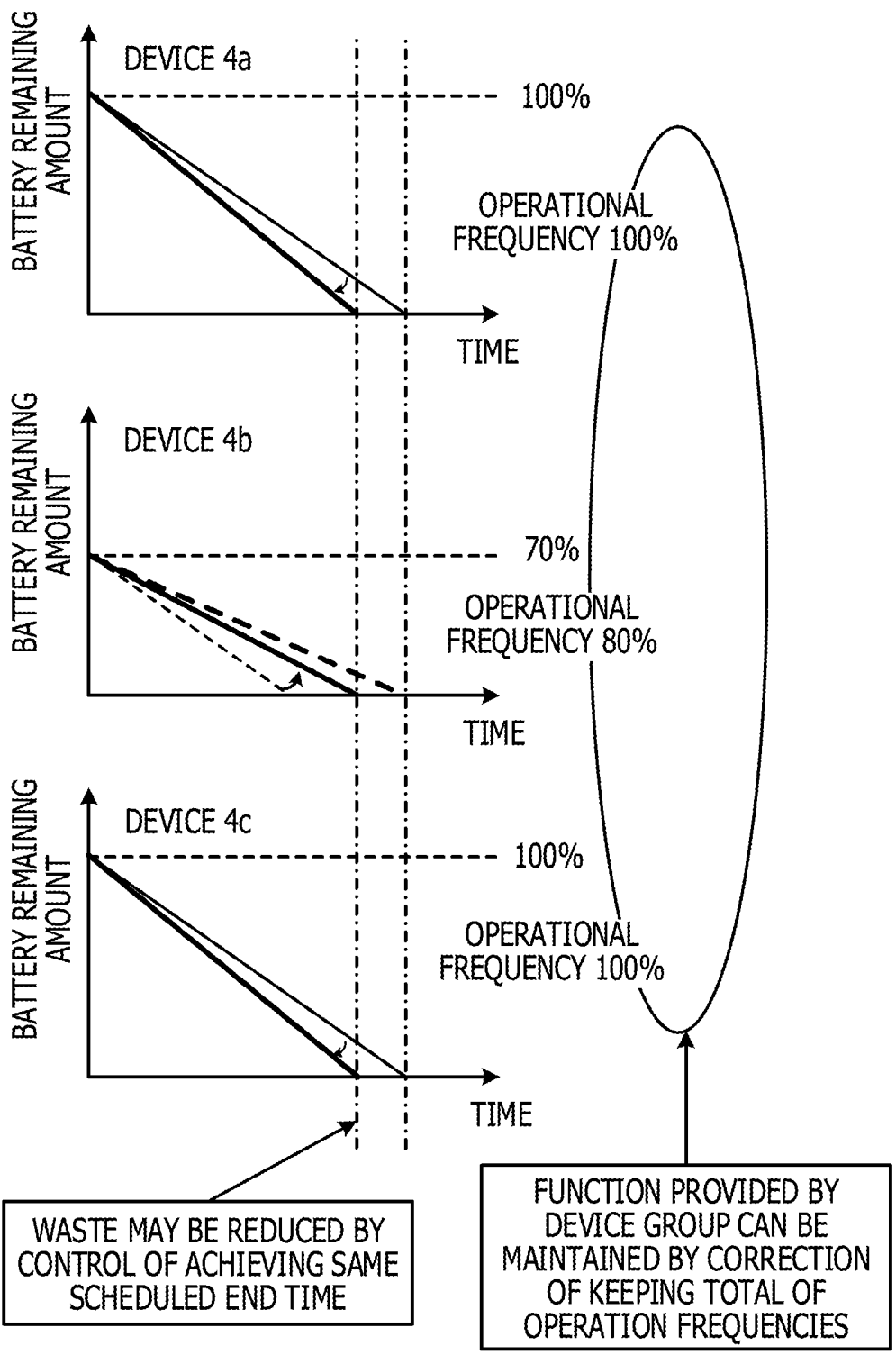
FIG. 19 depicts graphs illustrating an example when operation correction processing is performed for achieving substantially the same scheduled completion time and data volume between multiple sensor devices.

Also, in the case of FIG. 18, since the operation frequency of the sensor device 4b is decreased, the volume of data transmitted from the sensor device 4b (for instance, the observational data and the remaining amount data) becomes smaller than those of the sensor devices 4a, 4b. Thus, as illustrated in FIG. 19, the sensor control unit 54 may perform the operation correction processing for changing the frequency of performing an operation to reduce the remaining amount of the battery 12 according to the remaining amount of the battery 12 so that scheduled end times and data volumes are substantially the same between the multiple sensor devices. Consequently, the scheduled end times of the sensor devices and the volumes of data transmitted from the sensor devices may be uniform as much as possible.

Noted that management policy data indicating the details of the operation correction processing of each sensor device is stored in the device management policy list 46 (see FIG. 14), and scheduled end time data of the battery of each sensor device is stored in the battery running out prediction time list 47 (see FIG. 14). These pieces of data are distributed from the processing device 9 to the sensor devices via the communication device 31, and the control circuit 20 of each sensor device performs the operation correction processing in accordance with these pieces of distributed data.

Figure 20:
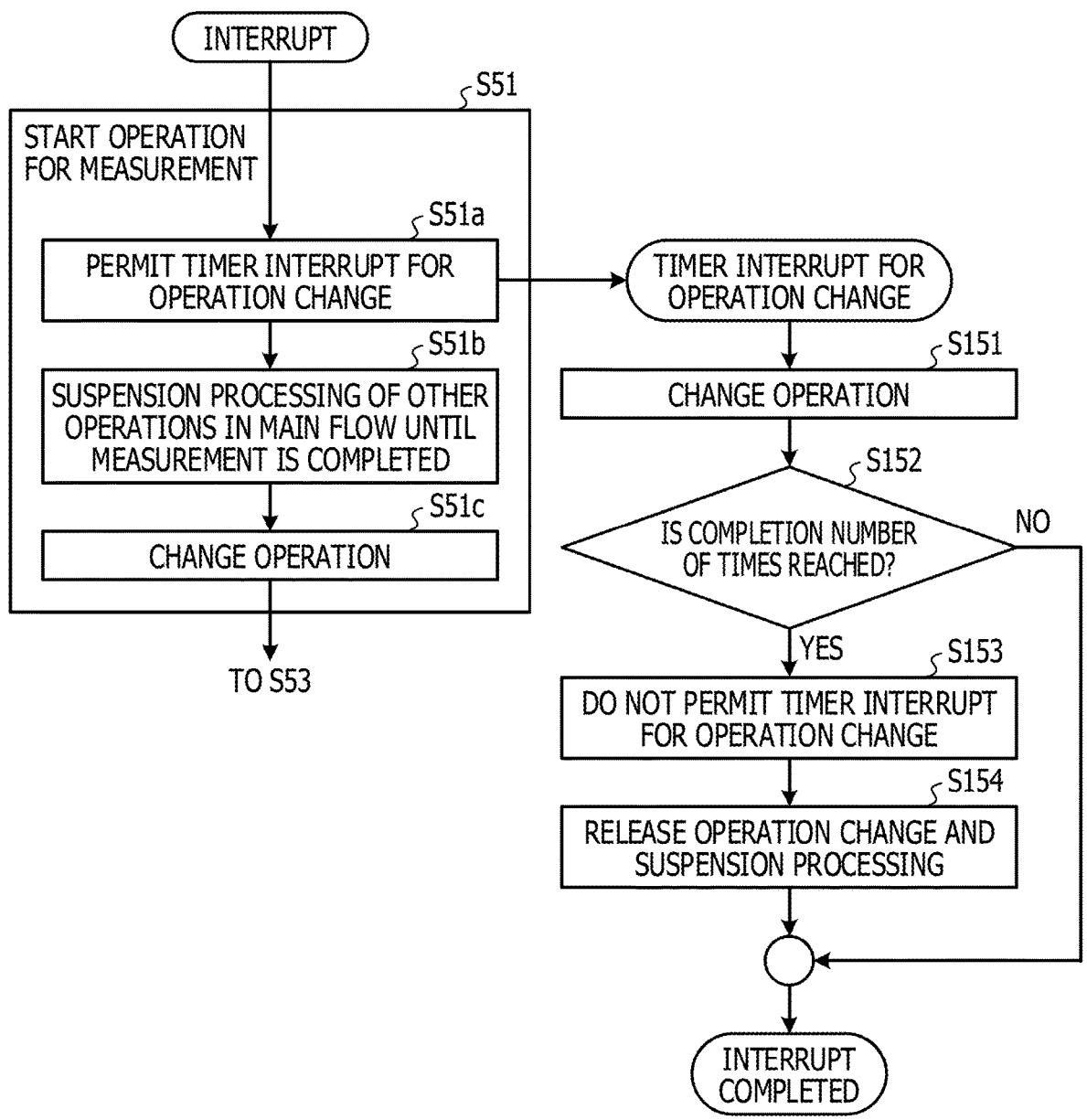
FIG. 20 is a flowchart illustrating an example flow of an operation for measurement in an operation pattern A of the sensor device.
Figure 21:
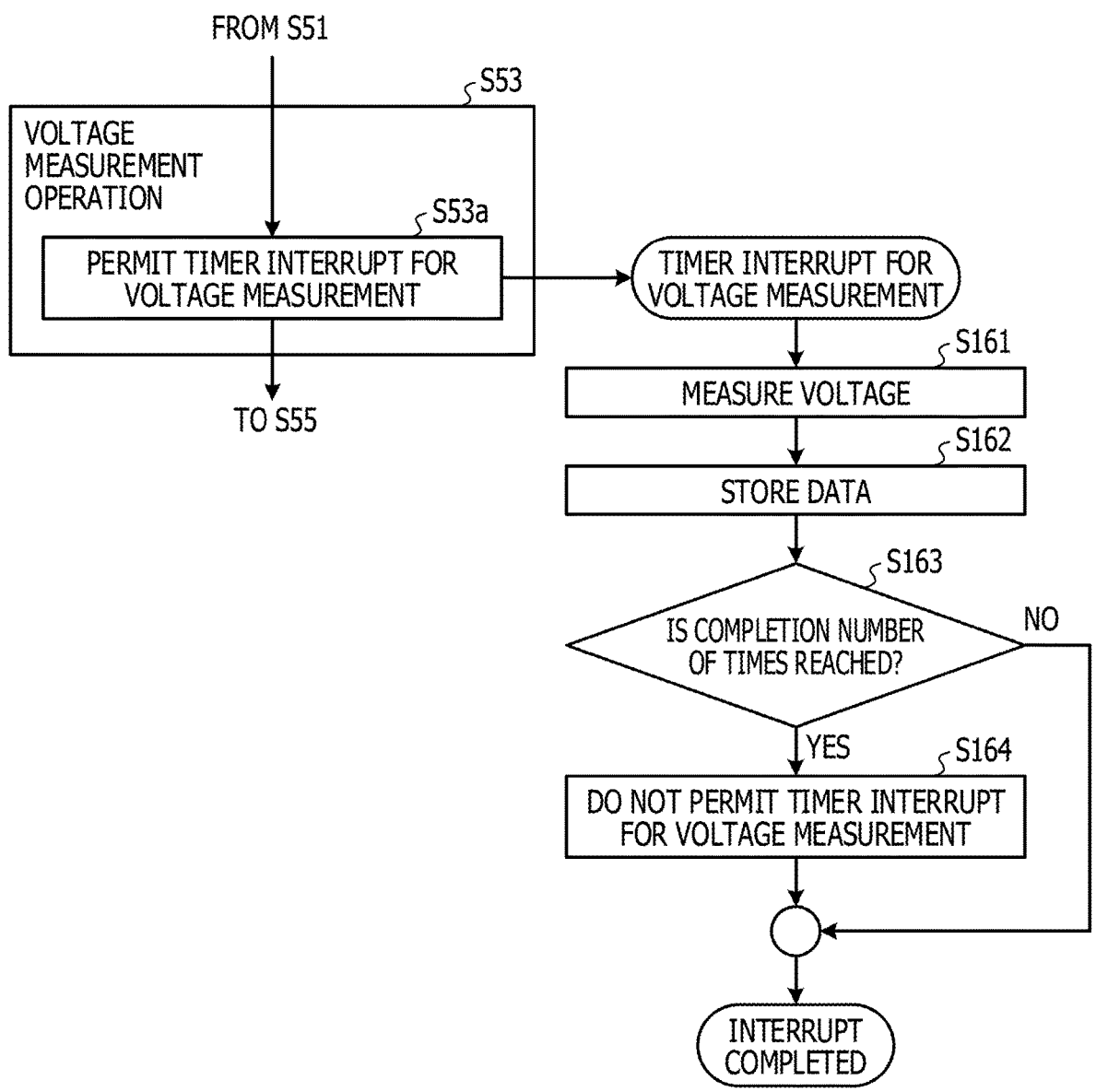
FIG. 21 is a flowchart illustrating an example flow of a voltage measurement operation in the operation pattern A of the sensor device.

FIG. 20 is a flowchart illustrating an example flow of an operation for measurement in an operation pattern A of the sensor device. FIG. 21 is a flowchart illustrating an example flow of a voltage measurement operation in the operation pattern A of the sensor device. The operation pattern A indicates an example of the operation pattern of the sensor device. FIG. 20 illustrates a detailed operation example of step S51 of FIG. 10, and FIG. 21 illustrates a detailed operation example of step S53 of FIG. 10.

In step S51 of FIG. 20, the operation control unit 51 starts to cause the control circuit 20 to perform a specific operation for measurement to generate a specific operating current which changes the output current I. The operation control unit 51 permits a timer interrupt for operation change (step S51a), performs suspension processing of other operations in the main flow illustrated in FIG. 10 until measurement of the output voltage V is completed (step S51b). The operation control unit 51 repeatedly performs the operation change each time a timer interrupt for operation change occurs until a predetermined completion number of times of change (operation change) is reached, the change being made from the operating current for measurement to a predetermined current value (step S51c).

The timer interrupt for operation change occurs with a predetermined period until the timer interrupt for operation change is not permitted. When a timer interrupt for operation change occurs, the operation control unit 51 performs operation change for changing the operating current for measurement to a predetermined current value (step S151). When a predetermined completion number of times of the operation change is reached (Yes in step S152), the operation control unit 51 does not permit the timer interrupt for operation change (step S153). The operation control unit 51 releases the operation change and the suspension processing of other operations (step S154).

In step S53 of FIG. 21, in a period during which the operation control unit 51 is generating a specific operating current, the output voltage V of the battery 12 is measured by the voltage measurement unit 21. The operation control unit 51 permits a timer interrupt for voltage measurement (step S53a).

The timer interrupt for voltage measurement occurs with a predetermined period until the timer interrupt for voltage measurement is not permitted. When a timer interrupt for voltage measurement occurs, the operation control unit 51 performs voltage measurement by the voltage measurement unit 21 (step S161), and stores the measured voltage data (step S162). When a predetermined completion number of times of the voltage measurement is reached (Yes in step S163), the operation control unit 51 does not permit the timer interrupt for voltage measurement (step S164).

Figure 22:
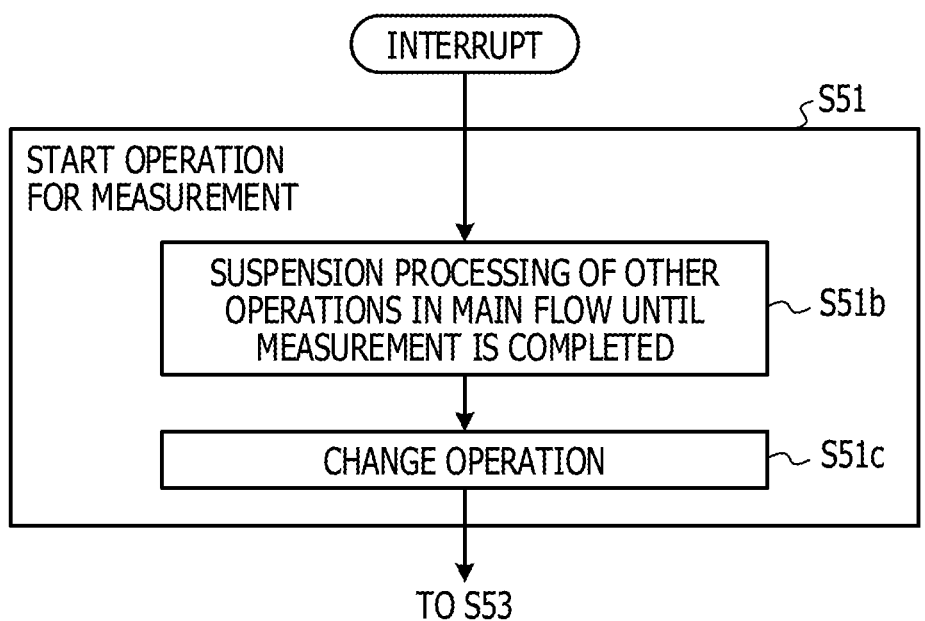
FIG. 22 is a flowchart illustrating an example flow of an operation for measurement in an operation pattern B of the sensor device.
Figure 23:
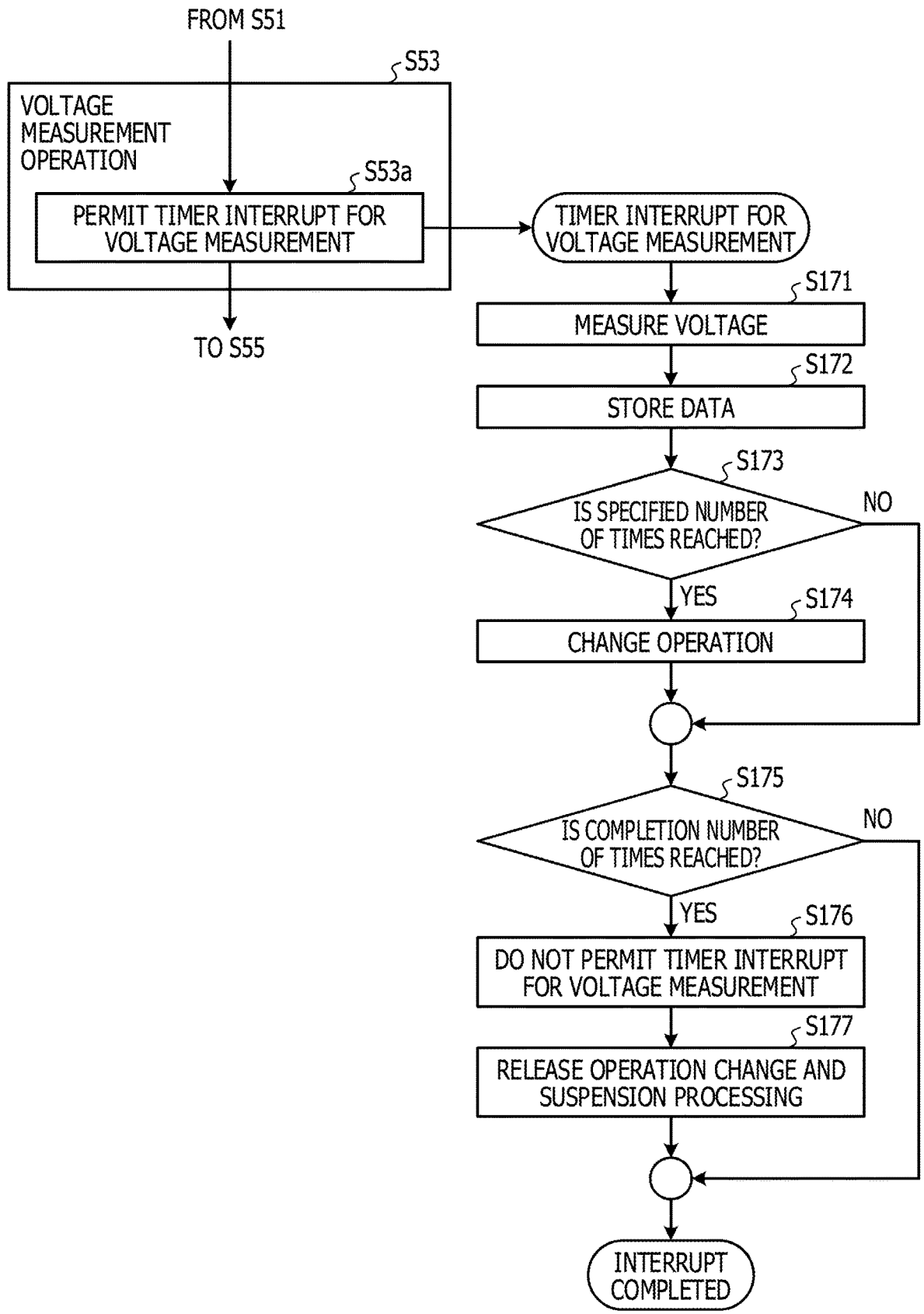
FIG. 23 is a flowchart illustrating an example flow of a voltage measurement operation in the operation pattern B of the sensor device.

FIG. 22 is a flowchart illustrating an example flow of an operation for measurement in an operation pattern B of the sensor device. FIG. 23 is a flowchart illustrating an example flow of a voltage measurement operation in the operation pattern B of the sensor device. The operation pattern B indicates an example of the operation pattern of the sensor device. FIG. 22 illustrates a detailed operation example of step S51 of FIG. 10, and FIG. 23 illustrates a detailed operation example of step S53 of FIG. 10.

In step S51 of FIG. 22, the operation control unit 51 starts to cause the control circuit 20 to perform a specific operation for measurement to generate a specific operating current which changes the output current I. The operation control unit 51 performs suspension processing of other operations in the main flow illustrated in FIG. 10 until measurement of the output voltage V is completed (step S51b). The operation control unit 51 continues the operation change until the timer interrupt for voltage measurement is not permitted (step S51c).

In step S53 of FIG. 23, in a period during which the operation control unit 51 is generating a specific operating current, the output voltage V of the battery 12 is measured by the voltage measurement unit 21. The operation control unit 51 permits a timer interrupt for voltage measurement (step S53a).

The timer interrupt for voltage measurement occurs with a predetermined period until the timer interrupt for voltage measurement is not permitted. When a timer interrupt for voltage measurement occurs, the operation control unit 51 performs voltage measurement by the voltage measurement unit 21 (step S171), and stores the measured voltage data (step S172). When a predetermined specified number of times of voltage measurement is not reached (No in step S173), the operation control unit 51 does not perform the operation change, and when the predetermined specified number of times of voltage measurement is reached (Yes in step S173), the operation control unit 51 performs the operation change (step S174).

When a predetermined completion number of times of the voltage measurement is reached (Yes in step S175), the operation control unit 51 does not permit the timer interrupt for voltage measurement (step S176). The operation control unit 51 releases the operation change and the suspension processing of other operations (step S177).

Figure 24:
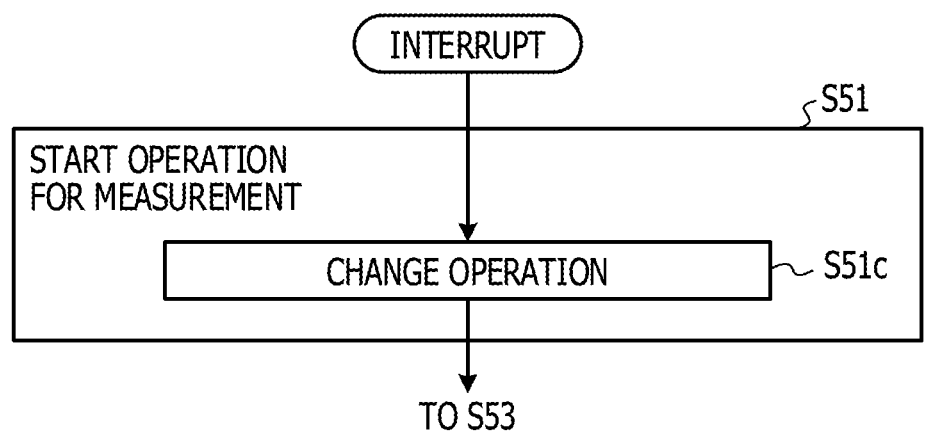
FIG. 24 is a flowchart illustrating an example flow of an operation for measurement in an operation pattern C of the sensor device.
Figure 25:
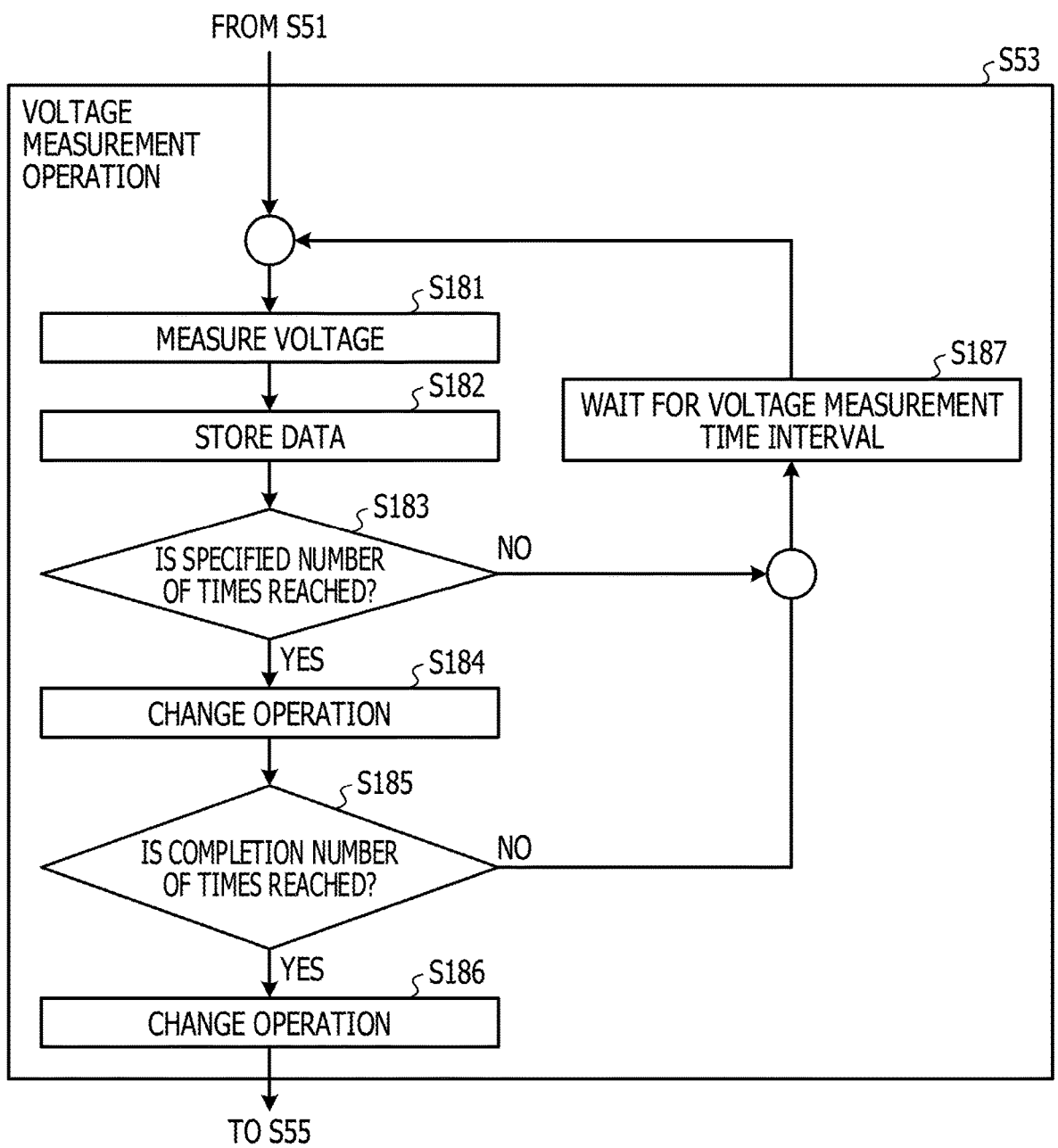
FIG. 25 is a flowchart illustrating an example flow of a voltage measurement operation in the operation pattern C of the sensor device.

FIG. 24 is a flowchart illustrating an example flow of an operation for measurement in an operation pattern C of the sensor device. FIG. 25 is a flowchart illustrating an example flow of a voltage measurement operation in the operation pattern C of the sensor device. The operation pattern C indicates an example of the operation pattern of the sensor device. FIG. 24 illustrates a detailed operation example of step S51 of FIG. 10, and FIG. 25 illustrates a detailed operation example of step S53 of FIG. 10. The operation pattern C indicates the case where an interrupt as in the operation patterns A, B does not occur.

In step S51 of FIG. 24, the operation control unit 51 starts to cause the control circuit 20 to perform a specific operation for measurement to generate a specific operating current which changes the output current I. The operation control unit 51 continues the operation change until a predetermined completion number of times of operation change is reached, the operation change for changing the operating current for measurement to a predetermined current value (step S51c).

The operation control unit 51 performs voltage measurement by the voltage measurement unit 21 (step S181), and stores the measured voltage data (step S182). When a predetermined specified number of times of voltage measurement is not reached (No in step S183), the operation control unit 51 stays in standby until a voltage measurement time interval elapses (step S187), and performs the voltage measurement again. When a predetermined specified number of times of voltage measurement is reached (Yes in step S183), the operation control unit 51 performs the operation change (step S184).

When a predetermined completion number of times of voltage measurement is not reached (No in step S185), the operation control unit 51 stays in standby until a voltage measurement time interval elapses (step S187), and performs the voltage measurement again. When a predetermined completion number of times of voltage measurement is reached (Yes in step S185), the operation control unit 51 performs an operation change for returning the current value to an initial value (step S186).

FIG. 26 is a table illustrating specific examples of setting numerical values. For instance, when the setting is made so that the operation change time interval is 1024 ms, the voltage measurement time interval is 1 ms, the predetermined completion number of times of voltage measurement is 1024 times, and the predetermined specified number of times of voltage measurement is 1024 times, the period of a rectangular wave for generating a specific operating current is 2048 ms. In this case, the rectangular wave frequency, the sample frequency, and the sample time are 0.49 Hz, 1 ksps, 1024 ms, respectively. The same goes with examples of combinations of other setting numerical values.

Figure 27:
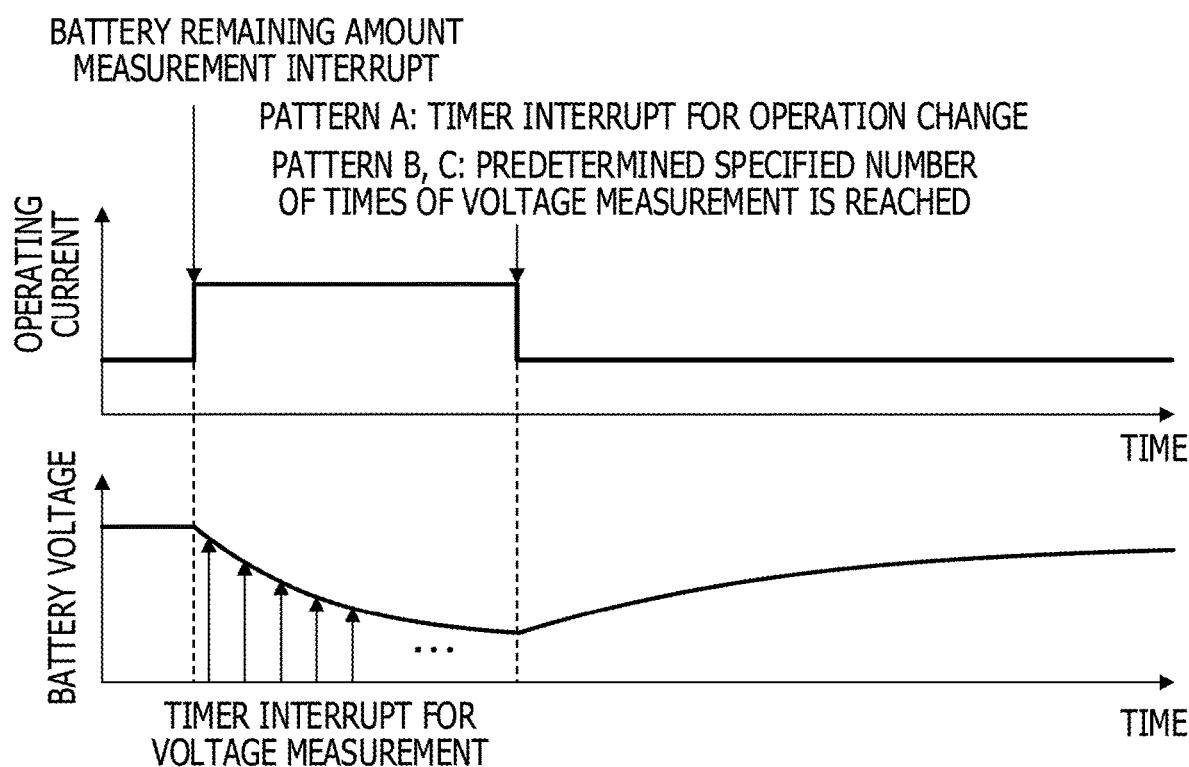
FIG. 27 is a timing chart illustrating an example operation for measurement and an example voltage measurement operation.

FIG. 27 is a timing chart illustrating an example operation for measurement and an example voltage measurement operation. In the case of operation by the operation pattern A, when a predetermined completion number of times of voltage measurement is reached, a timer interrupt for operation change is not permitted, and the operation change is completed. In the case of operation by the operation pattern B or the operation pattern C, when a predetermined specified number of times of voltage measurement, the operation change is completed.

Figure 28:
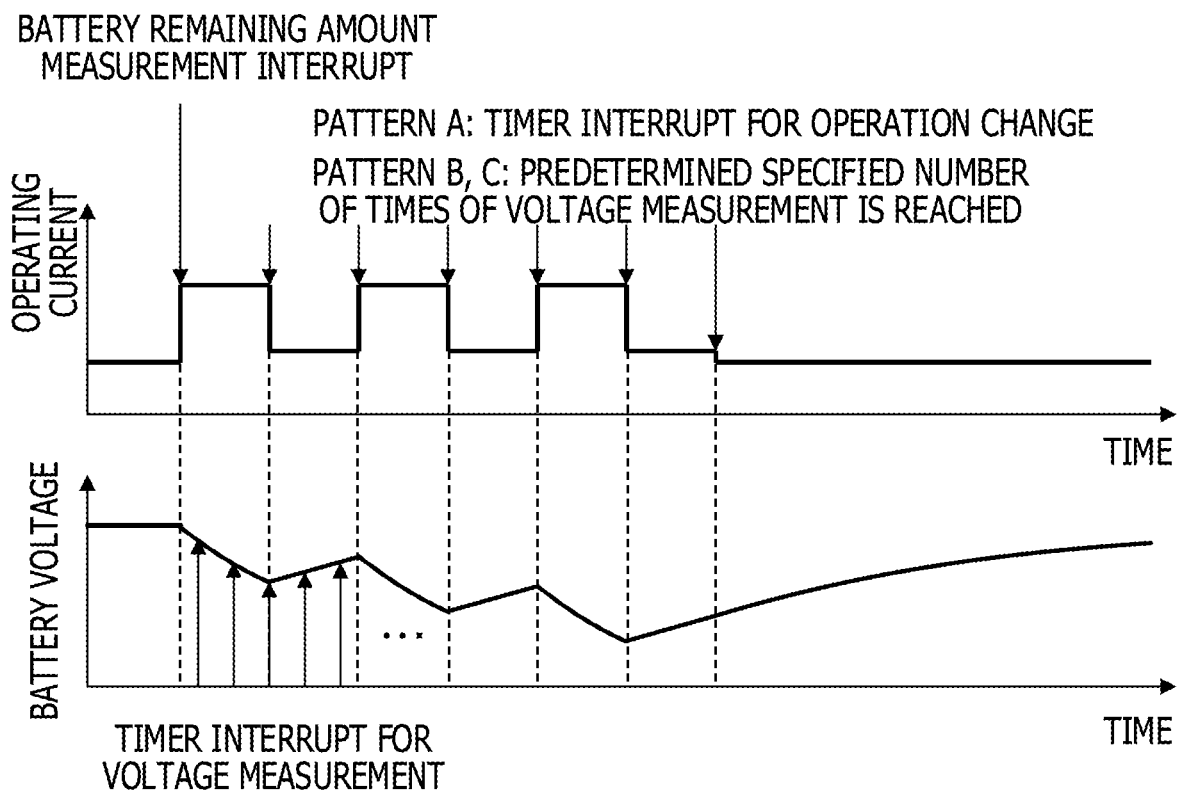
FIG. 28 is a timing chart illustrating an example operation for measurement and an example voltage measurement operation.

FIG. 28 is a timing chart illustrating an example operation for measurement and an example voltage measurement operation. FIG. 28 illustrates the case where a predetermined specified number of times of voltage measurement is any plural number. In the case of operation by the operation pattern A, when a predetermined specified number of times (three times in this case) of voltage measurement is reached, a timer interrupt for operation change is not permitted, and the operation change is completed. In the case of operation by the operation pattern B or the operation pattern C, when a predetermined specified number of times (three times in this case) of voltage measurement, the operation change is completed.

Figure 29:
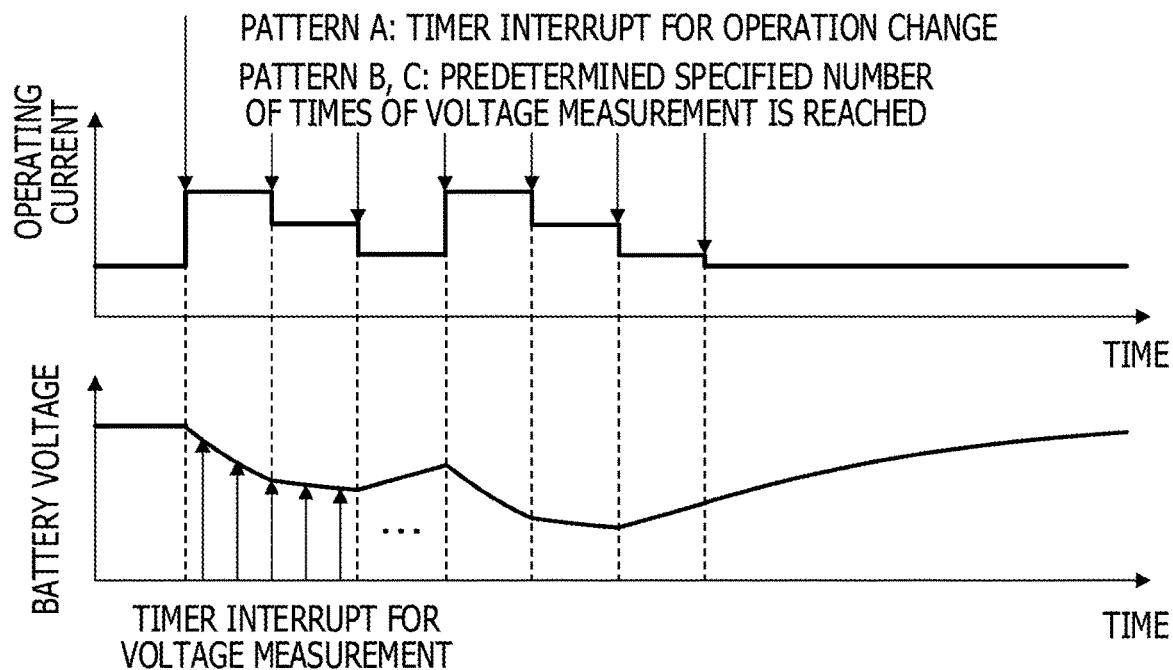
FIG. 29 is a timing chart illustrating an example operation for measurement and an example voltage measurement operation.

FIG. 29 is a timing chart illustrating an example operation for measurement and an example voltage measurement operation. FIG. 29 illustrates the case where an operation change pattern is formed by a current in a combination of rectangular waves with any multiple steps. In the case of operation by the operation pattern A, when a predetermined specified number of times (three times in this case) of voltage measurement is reached, the step of the maximum current value of the rectangular waves is lowered by one step. In the case of operation by the operation pattern B or the operation pattern C, when a predetermined specified number of times of voltage measurement, the step of the maximum current value of the rectangular waves is lowered by one step.

Figure 30:
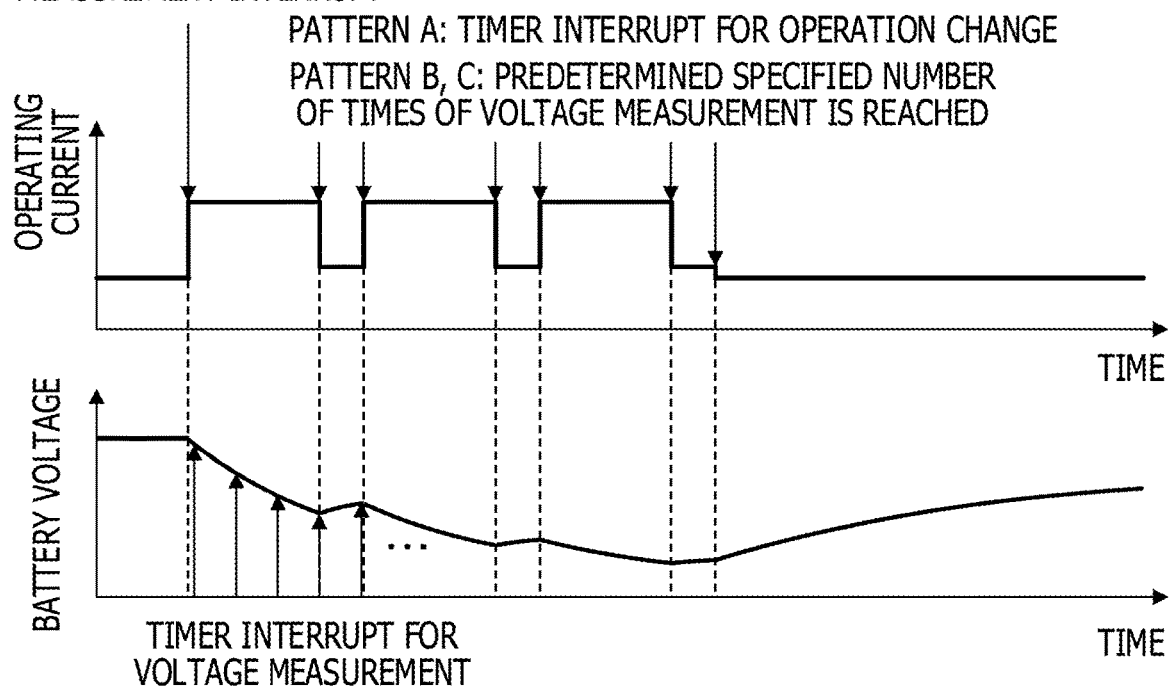
FIG. 30 is a timing chart illustrating an example operation for measurement and an example voltage measurement operation.

FIG. 30 is a timing chart illustrating an example operation for measurement and an example voltage measurement operation. FIG. 30 illustrates the case where the length of specified time for each operation change is varied. In the case of operation by the operation pattern A, when a predetermined completion number of times (four times in this case) of voltage measurement is reached, a timer interrupt for operation change is not permitted, and the operation change is completed. When a specified time elapses, the operation change is resumed.

Although the control circuit, the sensor device, and the battery remaining amount measurement method have been described above using the embodiments, the present disclosure is not limited to the embodiments. Various modifications and improvements such as a combination of and substitution by part or all of other embodiments are possible within a range of the present disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing apparatus comprising:
    a measurement circuit configured to measure an output voltage from a battery;
    a memory; and
    a processor circuit coupled to the memory, the processor circuit being configured to perform a plurality of processing, each of the plurality of processing causing the processor circuit to consume a respective value of electric current from the battery, the plurality of processing including a measurement processing, the measurement processing including:
        executing a first process by using electric power supplied from the battery, the executing of the first process being configured to cause the processor circuit to consume a predetermined value of electric current from the battery;
        obtaining, in response to beginning the executing of the first process, a measurement value from the measurement circuit, the obtaining measurement value indicating the output voltage measured during the executing of the first process;
        calculating an internal impedance of the battery by using the measurement value of the output voltage measured during the executing of the first process and a pre-setting value indicating the predetermined value of the electric current consumed by the processor circuit during the executing of the first process; and
        identify a remaining amount of the battery by using the measured internal impedance,
    wherein the information processing apparatus further comprises a sensor device configured to operate by using a second electric current supplied from the battery,
    wherein the processor circuit is configured to perform the measurement processing in either a first way or a second way,
    wherein the first way is configured to cause the executing of the first process to be performed in a period during which the sensor device does not operate,
    wherein the second way is configured to:
    cause the executing of the first process is performed in a period during which the sensor device operates;
    cause the processor circuit to measure an amount of the second electric current supplied from the battery to the sensor device; and
    cause the processor circuit to calculate the internal impedance of the battery by using the amount of the second electric current, a value of the predetermined electric current, and the measurement value of the output voltage measured during the executing of the first process.

2. The information processing apparatus according to claim 1, wherein
    a waveform of the predetermined electric current consumed by the executing of the first process is a rectangular waveform or a waveform in a combination of a plurality of rectangular waves.

3. The information processing apparatus according to claim 1, the information processing apparatus further comprising:
a communication device configured to communicate with other apparatus, wherein
the processor circuit is configured to cause the communication device to transmit information indicating the identified remaining amount of the battery to the other apparatus.

4. The information processing apparatus according to claim 1, wherein
the processor circuit is configured to, based on the remaining amount of the battery, change a frequency at which an operation for reducing the remaining amount is performed.

5. A method implemented by a computer, the method comprising:
executing, by a processor circuit of the computer, a first process by using electric power supplied from a battery, the executing of the first process being configured to cause the processor circuit to consume a predetermined value of electric current from the battery, the processor circuit being configured to perform a plurality of processing, each of the plurality of processing causing the processor circuit to consume a respective value of electric current from the battery, the first processing being one of the plurality of processing to be executed by the processor circuit;
obtaining, in response to beginning the executing of the first process, a measurement value from a measurement circuit configured to measure an output voltage from the battery, the measurement value indicating the output voltage measured during the executing of the first process;
calculating an internal impedance of the battery by using the measurement value of the output voltage measured during the executing of the first process and a presetting value indicating the predetermined value of the electric current consumed by the processor circuit during the executing of the first process;
identifying a remaining amount of the battery by using the measured internal impedance; and
operating a sensor device by using a second electric current supplied from the buttery,
wherein the executing of the first process is configured to be performed in either a first way or a second way,
wherein the first way is configured to cause the executing of the first process to be performed in a period during which the sensor device does not operate,
wherein the second way is configured to:
cause the executing of the first process is performed in a period during which the sensor device operates;
cause the processor circuit to measure an amount of the second electric current supplied from the battery to the sensor device; and
cause the processor circuit to calculate the internal impedance of the battery by using the amount of the second electric current, a value of the predetermined electric current, and the measurement value of the output voltage measured during the executing of the first process.

6. The method according to claim 5, wherein
a waveform of the predetermined electric current consumed by the executing of the first process is a rectangular waveform or a waveform in a combination of a plurality of rectangular waves.

7. The method according to claim 5, further comprising:
executing processing by using a communication device of the computer, the communication device being configured to communicate with other apparatus,
wherein the processing includes transmitting information to the other apparatus, the information indicating the identified remaining amount of the battery.

8. The method according to claim 5, further comprising:
based on the remaining amount of the battery, changing a frequency at which an operation for reducing the remaining amount is performed.

9. A non-transitory computer-readable storage medium storing a program that causes an information processing apparatus to execute a process, the process comprising:
executing, by a processor circuit of the information processing apparatus, a first process by using electric power supplied from a battery, the executing of the first process being configured to cause the processor circuit to consume a predetermined value of electric current from the battery, the processor circuit being configured to perform a plurality of processing, each of the plurality of processing causing the processor circuit to consume a respective value of electric current from the battery, the first processing being one of the plurality of processing to be executed by the processor circuit;
obtaining, in response to beginning the executing of the first process, a measurement value from a measurement circuit configured to measure an output voltage from the battery, the measurement value indicating the output voltage measured during the executing of the first process;
calculating an internal impedance of the battery by using the measurement value of the output voltage measured during the executing of the first process and a presetting value indicating the predetermined value of the electric current consumed by the processor circuit during the executing of the first process;
identifying a remaining amount of the battery by using the measured internal impedance; and
operating a sensor device by using a second electric current supplied from the buttery,
wherein the executing of the first process is configured to be performed in either a first way or a second way,
wherein the first way is configured to cause the executing of the first process to be performed in a period during which the sensor device does not operate,
wherein the second way is configured to:
cause the executing of the first process is performed in a period during which the sensor device operates;
cause the processor circuit to measure an amount of the second electric current supplied from the battery to the sensor device; and
cause the processor circuit to calculate the internal impedance of the battery by using the amount of the second electric current, a value of the predetermined electric current, and the measurement value of the output voltage measured during the executing of the first process.

10. The non-transitory computer-readable storage medium according to claim 9, wherein
a waveform of the predetermined electric current consumed by the executing of the first process is a rectangular waveform or a waveform in a combination of a plurality of rectangular waves.

11. The non-transitory computer-readable storage medium according to claim 9, further comprising:
- executing processing by using a communication device of the computer, the communication device being configured to communicate with other apparatus,
- wherein the processing includes transmitting information to the apparatus, the information indicating the identified remaining amount of the battery.

12. The non-transitory computer-readable storage medium according to claim 9, further comprising:
- based on the remaining amount of the battery, changing a frequency at which an operation for reducing the remaining amount is performed.

\* \* \* \* \*